(12) United States Patent
Eschauzier et al.

(10) Patent No.: US 7,898,330 B2
(45) Date of Patent: Mar. 1, 2011

(54) CLASS AB AMPLIFIER SYSTEMS

(75) Inventors: Rudy G. H. Eschauzier, Bergschenhoek (NL); Nico van Rijn, Katwijk (NL)

(73) Assignee: Number 14 B.V., Bergschenhoek (NL)

( * ) Notice: Subject to any disclaimer, the term of this patent is extended or adjusted under 35 U.S.C. 154(b) by 116 days.

(21) Appl. No.: 12/427,537

(22) Filed: Apr. 21, 2009

(65) Prior Publication Data
US 2010/0264986 A1    Oct. 21, 2010

(51) Int. Cl.
*H03F 3/45*    (2006.01)
(52) U.S. Cl. .................. 330/255; 330/257; 330/264
(58) Field of Classification Search .............. 330/253, 330/255, 257, 262–264
See application file for complete search history.

(56) References Cited

U.S. PATENT DOCUMENTS

| 5,764,101 | A | 6/1998 | Archer |
| 6,583,669 | B1 * | 6/2003 | Eschauzier et al. .......... 330/255 |
| 6,624,696 | B1 | 9/2003 | Eschauzier et al. |
| 7,443,237 | B1 | 10/2008 | Liu |
| 2009/0066415 | A1 | 3/2009 | Kim |

OTHER PUBLICATIONS

Bult, Klaas, et al., "A Fast-Settling CMOS Op Amp for SC Circuits with 90-dB DC Gain", *IEEE Journal of Solid-State Circuits*, vol. 25, No. 6, (Dec. 1990), pp. 1379-1384.
"Extended European Search Report Dated Aug. 4, 2010" European Patent Application No. 10159947.0.
Griffith, Richard, et al., "A 1-V BiCMOS Rail-to-Rail Amplifier with n-Channel Depletion Mode Input Stage", *IEEE Journal of Solid-State Circuits*, vol. 32, No. 12, (Dec. 1997), pp. 2012-2022.
Lehmann, Torsten, et al., "1-V Power Supply CMOS Cascode Amplifier", *IEEE Journal of Solid-State Circuits*, vol. 36, No. 7, (Jul. 2001), pp. 1082-1086.

* cited by examiner

*Primary Examiner*—Khanh V Nguyen
(74) *Attorney, Agent, or Firm*—Blakely Sokoloff Taylor & Zafman LLP

(57) ABSTRACT

The present invention comprises class AB amplifier systems exhibiting low quiescent power, low-voltage operation, high gain, high bandwidth, low noise and low offset, and requiring a small die area. The amplifier systems use a differential first stage and a second stage of two pair of nested current mirrors interconnected in a particular way. Using a low quiescent current, the present invention reduces power consumption almost to a theoretical minimum. Also the circuit will operate at an input of only 1.8V with a threshold voltage of 1V. Various embodiments are disclosed.

24 Claims, 38 Drawing Sheets

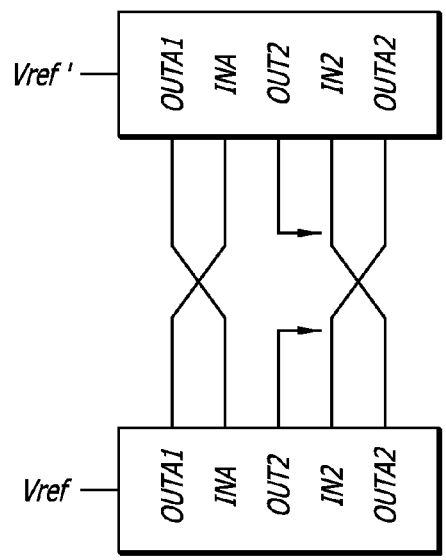
FIG. 11
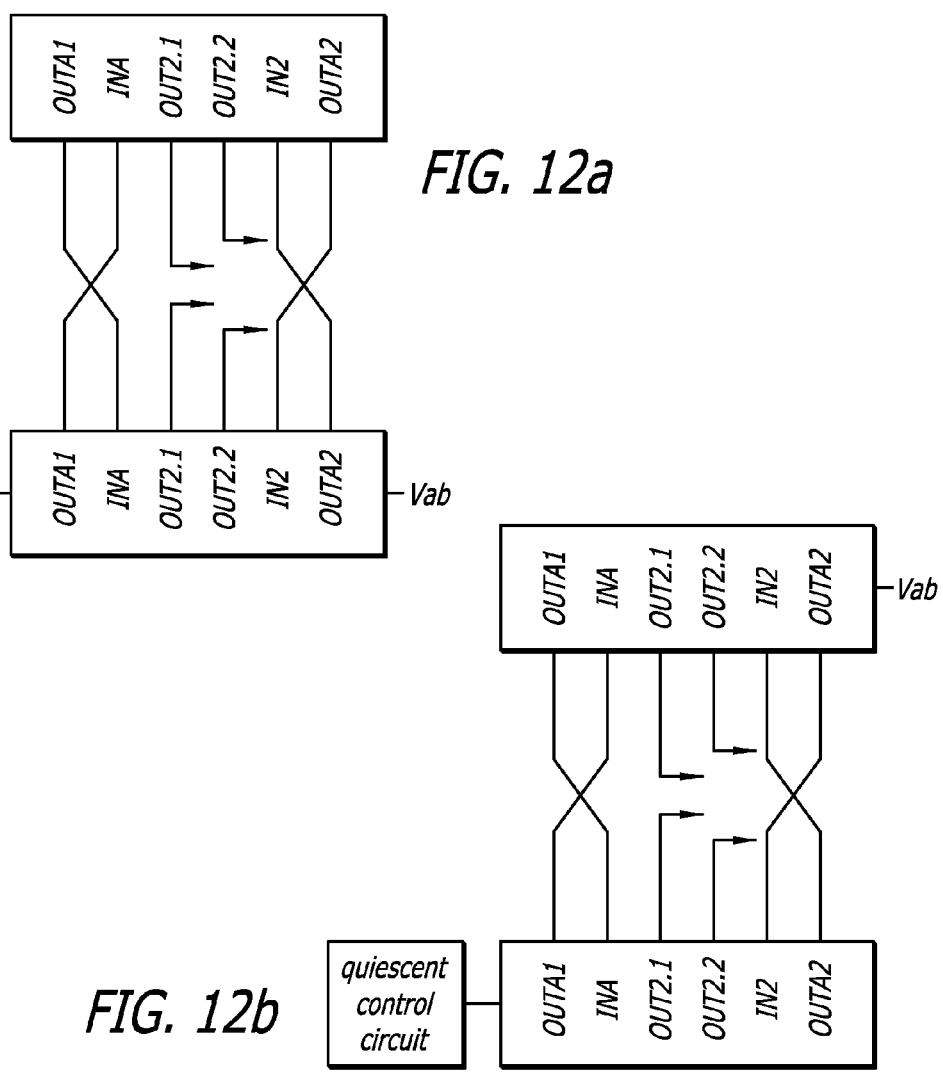
FIG. 12a
FIG. 12b

CLASS AB AMPLIFIER SYSTEMS

BACKGROUND OF THE INVENTION

1. Field of the Invention

The present invention relates to the field of operational amplifiers.

2. Prior Art

Key performance specifications of operational amplifiers are its input referred offset and noise voltages. These are usually specified as single error sources at the input of the amplifier.

FIG. 1 shows a typical prior art folded cascode operational amplifier. Its input referred offset voltage Vos is mainly due to the offset voltages between matched transistor pairs M1-M2, M3-M4 and M6-M7. These offset voltages can be calculated back to the input as $$Vos = \Delta V1,2 + \frac{Gm3,4}{Gm1,2}\Delta V3,4 + \frac{Gm6,7}{Gm1,2}\Delta V6,7 \quad (1)$$

Where $\Delta V$ and $G_m$ are the offset voltages and transconductances of the indicated transistors. M8-M9 and M10-M11 are cascode devices and therefore do not contribute significantly to Vos.

The input referred RMS voltage noise $Vn_{in}$ can be calculated from $$\overline{Vn_{in}^2} = \overline{V_n1^2} + \overline{V_n2^2} + \left(\frac{Gm3}{Gm1,2}\right)^2\overline{V_n3^2} + \left(\frac{Gm4}{Gm1,2}\right)^2\overline{v_n4^2} + \quad (2)$$
$$\left(\frac{Gm5}{Gm1,2}\right)^2\overline{v_n5^2} + \left(\frac{Gm6}{Gm1,2}\right)^2\overline{v_n6^2}$$

Where $V_n i$ is the RMS voltage noise of each contributing transistor. Similar to Vos, it can be assumed that the noise voltages from cascode devices M8-M11 do not add to $Vn_{in}$.

To minimize both Vos and $V_{in}$, the transconductance of the input stage $G_m 1,2$ should be maximized and the transconductances of the transistors in the folding stage M3-M6 should be minimized. This is traditionally done by choosing the W/L ratios such that M1 and M2 operate in weak inversion and M3-M6 operate in strong inversion. Further decreasing the transconductances of M3-M6 by lowering their drain currents is usually not done as it deteriorates the slewrate of the amplifier.

In strong inversion the $G_m$ of a MOS transistor is defined as $$G_m = \frac{2I_d}{V_{gs,eff}} \quad (3)$$

where $I_d$ is the drain current and $V_{gs,eff}$ is the effective gate-source voltage or gate-source voltage $V_{gs}$ minus threshold voltage $V_t$. The transconductance in weak inversion is $$G_m = \frac{I_d}{nV_{th}} \quad (4)$$

where n is the weak inversion slope factor with an approximate value of 2 and $V_{th}$ is the thermal voltage kT/q which is about 25 mV at room temperature.

As an example, consider the offset voltages in the input transistor pair to be 5 mV and in transistor pairs M3-M4 and M5-M6 to be 10 mV. To maintain good bandwidth in the folding stage, transistors M3-M6 have a much smaller area than M1-M2 and therefore have larger offset voltages. $V_{gs,eff}$ is in the order of 100 mV. Much more effective gate-source voltage is usually not allowed as it increases the minimum supply voltage the circuit can operate at and limits the common mode input voltage range. Vos is then $$5\text{ mV} + 5\text{ mV} + \frac{5\text{ mV}}{2}.$$

It can be seen that the contributions to Vos from the offset voltages in transistor pairs M3-M4 and M5-M6 are in the same order as that from input pair M1-M2.

The noise of a MOS transistor is defined as $$\frac{\overline{Vn^2}}{\Delta f} = 4kT\frac{2}{3}\frac{1}{Gm} + K\frac{I^a D}{Gm^2 f} \quad (5)$$

where k is the Boltzman constant, T is the temperature, K is a constant for a given device and a is a constant between 0.5 and 2. The first term on the right hand side of formula 5 is the thermal noise component, and the second term is the flicker noise component. The transconductance of an NMOS transistor is about 3 times that of a PMOS transistor when both operate under the same conditions. Also, flicker noise in NMOS devices is usually much larger than in PMOS devices. Substituting (5) into (2) for each individual transistor results in the noise sources from M3 and M4 to be dominant in the circuit.

BRIEF DESCRIPTION OF THE DRAWINGS

FIG. 11 illustrates the interconnection of the upper and lower nested mirrors for the embodiments of FIGS. 6a-6c, 6f, 7a, 7b, 8a, 8b, 9a and 9b.

FIGS. 12a and 12b illustrate the interconnection of upper and lower nested current mirrors having split output transistors.

DETAILED DESCRIPTION OF THE PREFERRED EMBODIMENTS

In the description and in the claims to follow, the terms current inputs and current outputs are used generally without regard to current direction, but are used more in the context of cause and effect.

Figure 2:
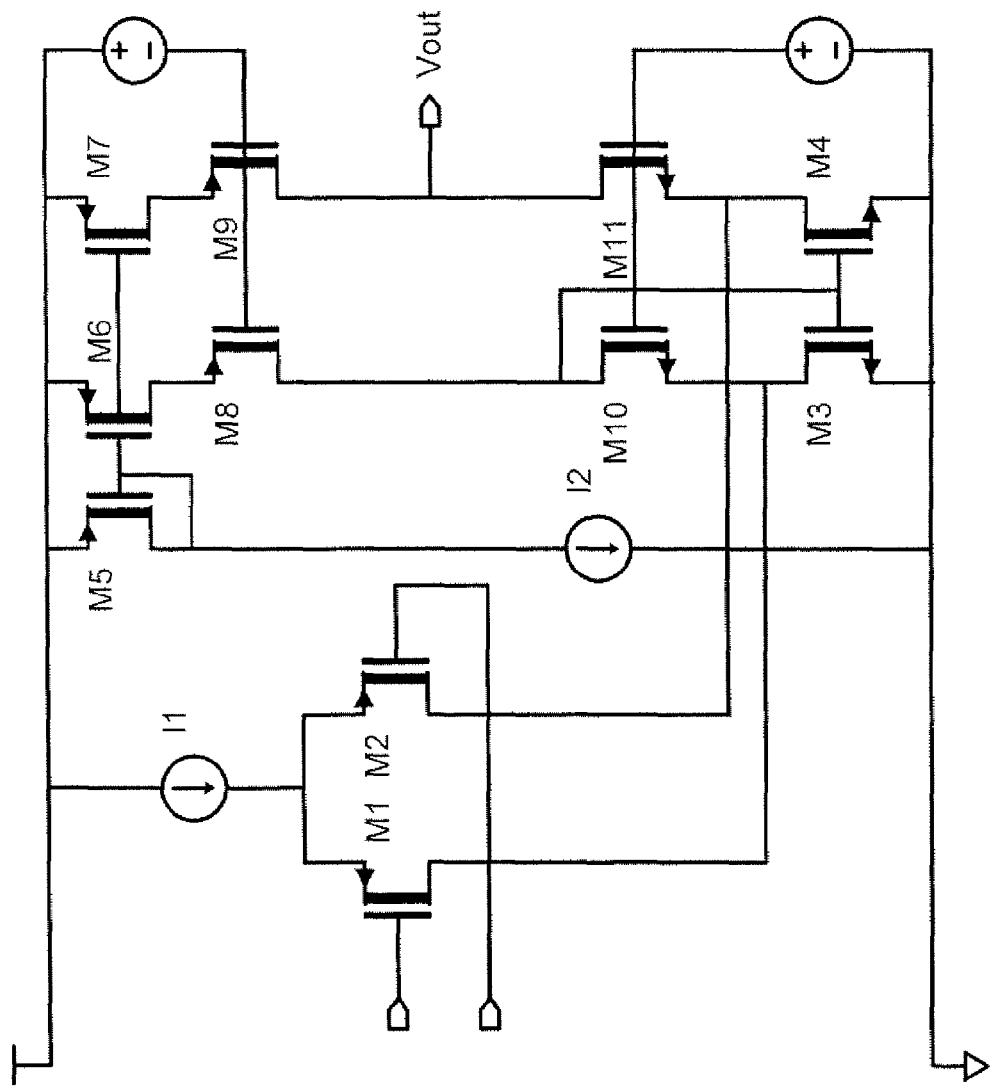
FIG. 2 shows an amplifier with reduced quiescent current in the folding stage.

To further decrease the contribution of offset and noise from the transistors in the folding stage, its quiescent current should be reduced without affecting the large signal properties. FIG. 2 shows an amplifier with reduced quiescent current in the folding stage.

Transistors M3 and M4 are connected as a current mirror while M6 and M7 are current sources. When I2<<I1 and the mirror ratio M5-M6 and M5-M7 is 1, the transconductance of M3-M7, and thus their contributions to Vos and $V_{in}$, are decreased. When the gate of M1 is pulled below the gate of M2 such that tail current I1 flows completely through M1 into M3, the current in M4, equal to the current in M3, will flow out of output node Vout. This output current does not depend on the quiescent current through M7 and is only limited by tail current I1.

When I1 flows completely through M2 into M4, the current flowing into Vout is limited by the quiescent current in M7 which is much smaller than I1 thus limiting the slewrate of the amplifier.

The current mirror in FIG. 2 only realizes the desired behavior of low quiescent current and maximum output current when this current flows into diode connected devices M3 and M10. A next step would be to create current mirrors for both sides as is shown in FIG. 3.

When tail current I1 flows through M1 into M3, an equal current flows from Vout into M4. Likewise, when I1 flows through M2 into M12, it is copied in M13, mirrored by M6-M7 and flows into Vout.

Figure 1:
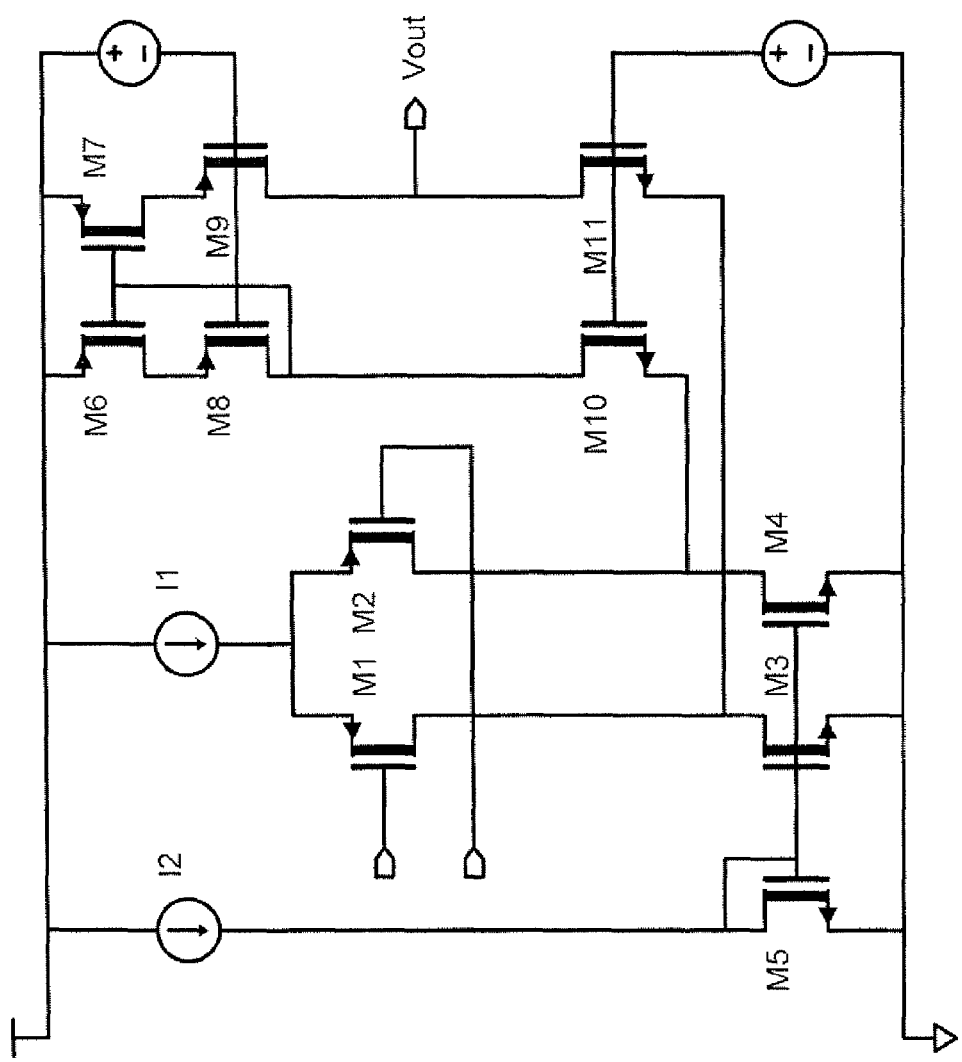
FIG. 1 illustrates a typical prior art folded cascode operational amplifier.
Figure 3:
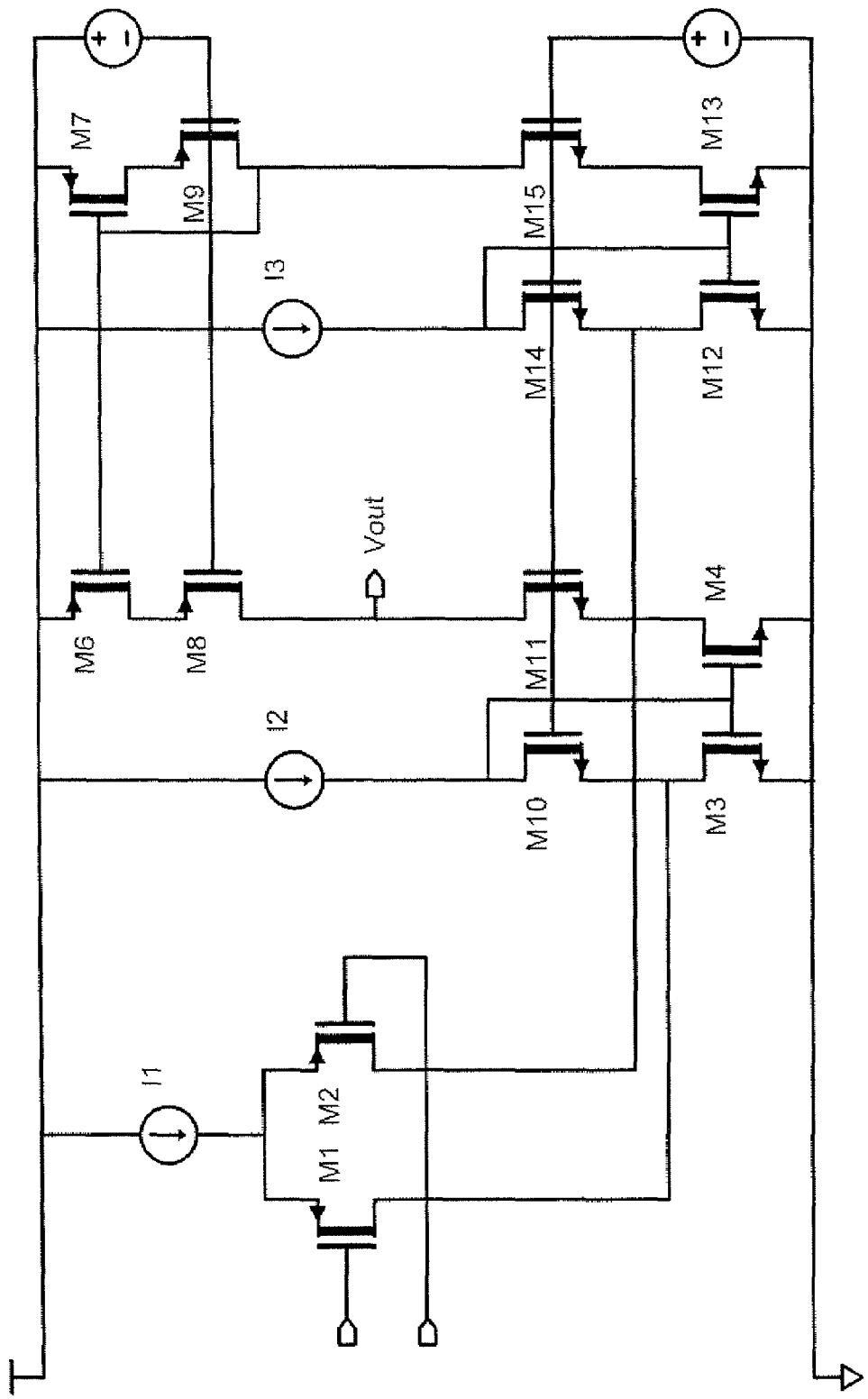
FIG. 3 illustrates an amplifier similar to that of FIG. 2, but with current mirrors on both sides.

FIG. 3 shows the 2 mirrors at the bottom side of the folding stage having low quiescent current and good large signal properties. Disadvantages are the increased complexity compared to the circuit in FIG. 1, increase the supply current and contribute to noise and offset.

Figure 4:
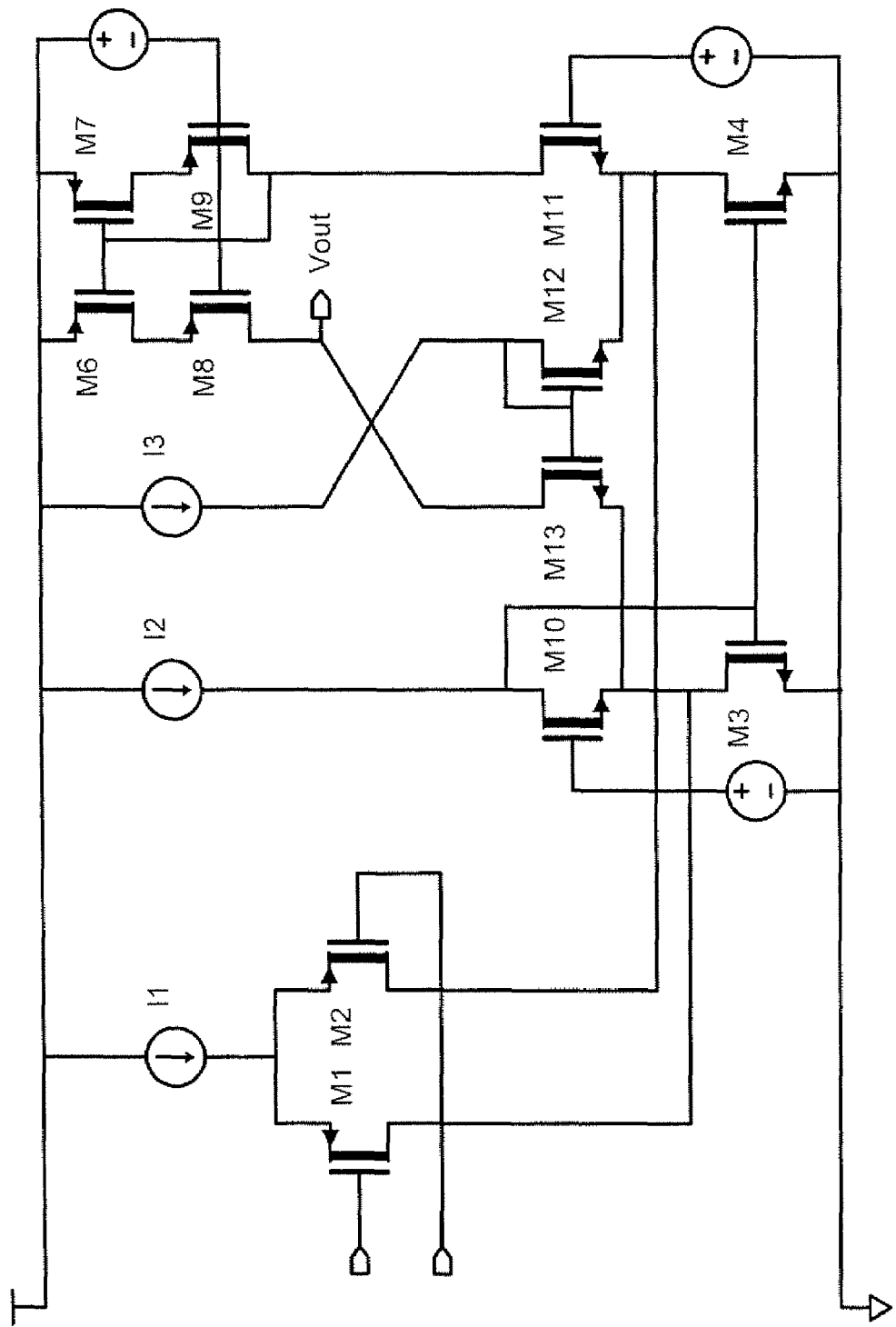
FIG. 4 illustrates an amplifier similar to that of FIG. 3, but with the current mirrors being combined.

By combining the two mirrors as shown in FIG. 4, the complexity becomes as simple as that of a traditional folding cascade stage.

The two mirrors M3-M4 and M12-M13 at the bottom of the folding stage in FIG. 3 are now placed anti parallel on top of each other. When tail current I1 flows into M3 through M1, it will be copied in M4, through M6M7 into Vout. When I1 flows through M2, the drain voltage of M4 will increase. As M12 is connected as diode with a fixed drain current, the gate of M12 and thus the gate of M13 will increase also. The voltage at the source of M13 is fixed because of M10 and I2 and thus the current through M13 will increase. This current is forced into M3 by the loop formed by M3 and M10. The current through M4 will then also increase until the complete tail current flows through it and thus also through M13.

Figure 5:
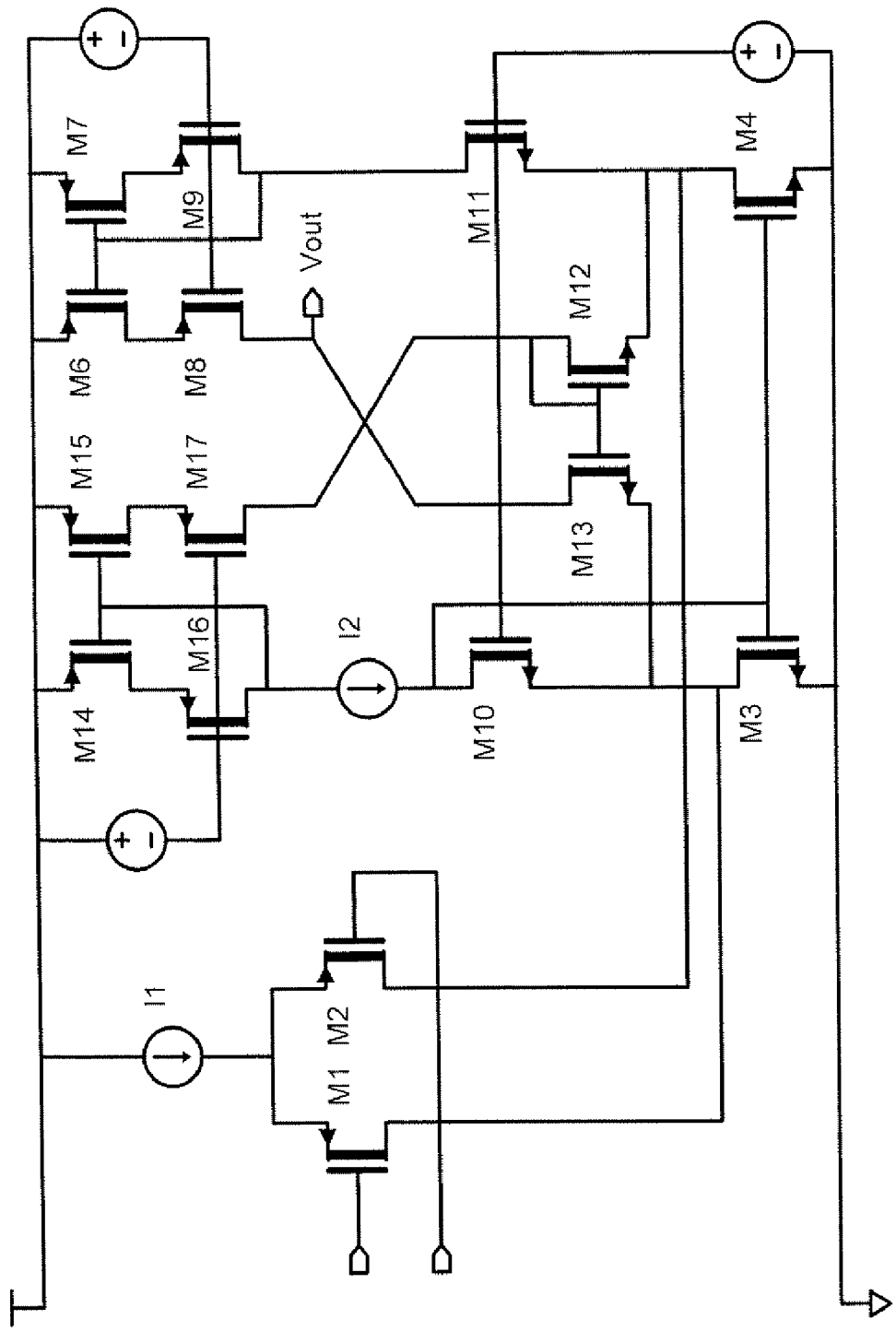
FIG. 5 illustrates an amplifier similar to that of FIG. 4, but with the two current sources I2 and I3 being replaced by a current mirror and a floating current source I2, enabling the circuit to operate with either a PMOS and/or NMOS input stage for rail-to-rail operation.

The two current sources I2 and I3 can be replaced by a current mirror and a floating current source I2 as drawn in FIG. 5, enabling the circuit to operate with either a PMOS and/or NMOS input stage for rail-to-rail operation.

Floating current source I2, when implanted with a transistor, in series with diode connected devices M3/M10 and M14/M16 limit the minimum supply voltage the circuit can operate at to 2 Vt+3 Vdsat. FIG. 6b shows the implementation of a low voltage floating current source, enabling a minimum supply voltage of Vt+3 Vdsat. M8 is split into two transistors, of which both gates are connected together as well as both sources, forcing the drain currents to be equal. M10 is also split and act as a differential pair. The "quiescent control circuitry" block forces M10B to have a defined drain current. Mirror M8A and M8B forces the current in M10A to be equal to the current in M10B. The two diodes M3 and M6 are not in series anymore but can operate next to each other.

Also, the two current mirrors M6M7 and M16M17 have been replaced by a similar low voltage stacked mirror structure as M3M4-M10-M13 to lower the contribution of noise and offset. FIGS. 6b and 6g-6h show the same amplifier with one implementation of the "quiescent control circuitry" block.

Mirrors M16M17 and M12M13 can also been seen as if the original cascode transistors M10, M11, M8 and M9 were split. One half of these transistors are still connected as cascodes, the other half form the mirrors. Transistors M16M17 and M12M13 therefore do not contribute to noise and offset in the amplifier.

Besides decreasing the amplifiers noise and offset voltages, the folding stage circuit has an increased output impedance comparable to a gainboosted amplifier and a higher bandwidth. The increased output impedance can be explained as follows:

When Vout decreases by a small amount ΔV, the current through M13 decreases by ΔI=ΔV/Rout13. The ΔI difference in M13 forces the same ΔI difference in M3 and M4 which is mirrored through M16M17 back into Vout. The resulting current flowing into Vout as a result of the output impedance of M13 is the difference between the ΔI currents in M13 and M16 thus increasing the output impedance.

The higher bandwidth is achieved by the signal current from M1 and M2 not going through mirrors M3M4 and/or M6M7 but having a direct path through the cascode devices M13, M11, M17 and M16. As these devices are much smaller than current mirrors M3M4 and M6M7, they have a wider bandwidth.

Figure 6A:
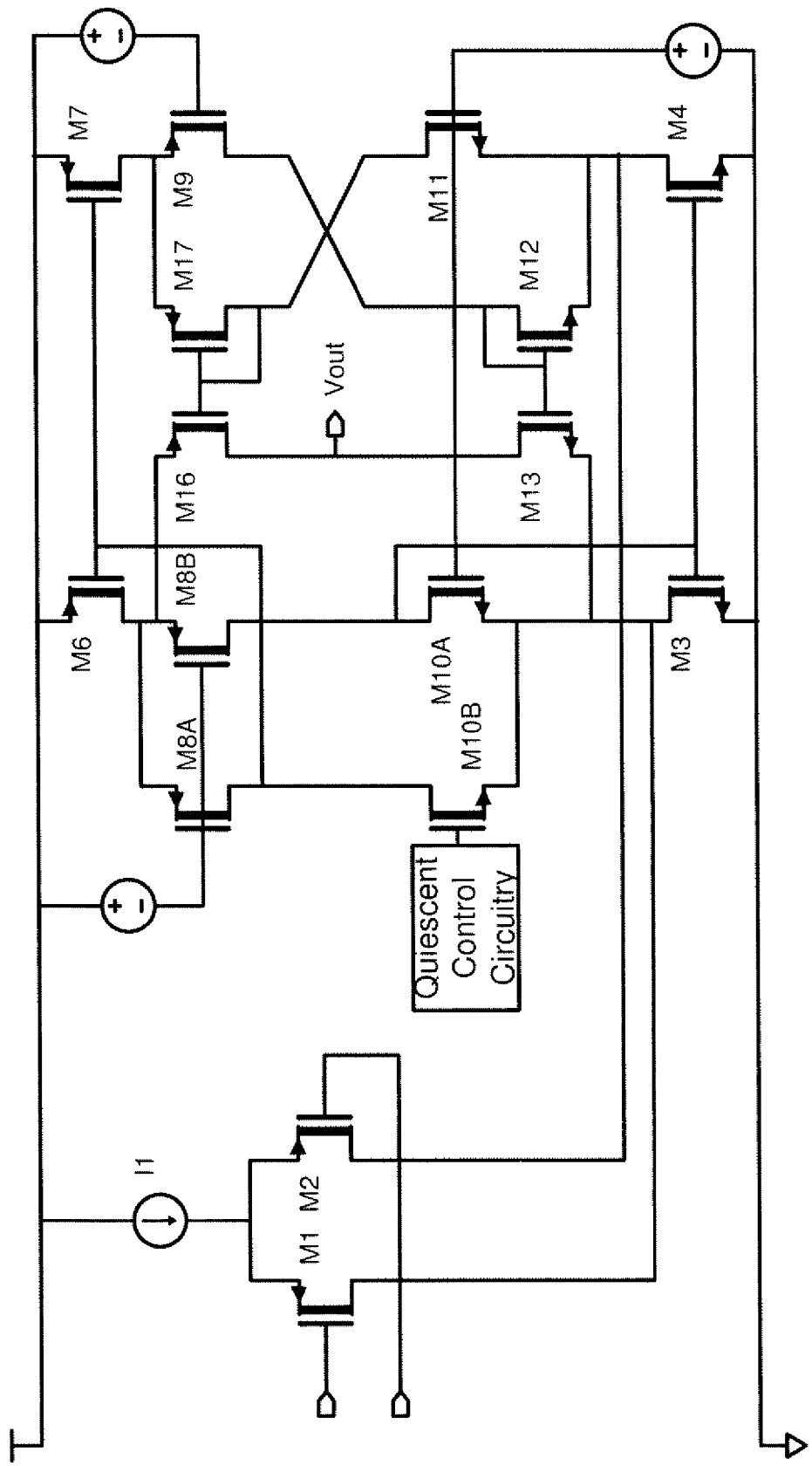
FIG. 6a-6h illustrate embodiments having a folding stage as a bottom half containing 2 stacked mirrors and a top half containing 2 stacked mirrors, and further illustrating a class AB output stage with various output stage drivers.
Figure 6B:
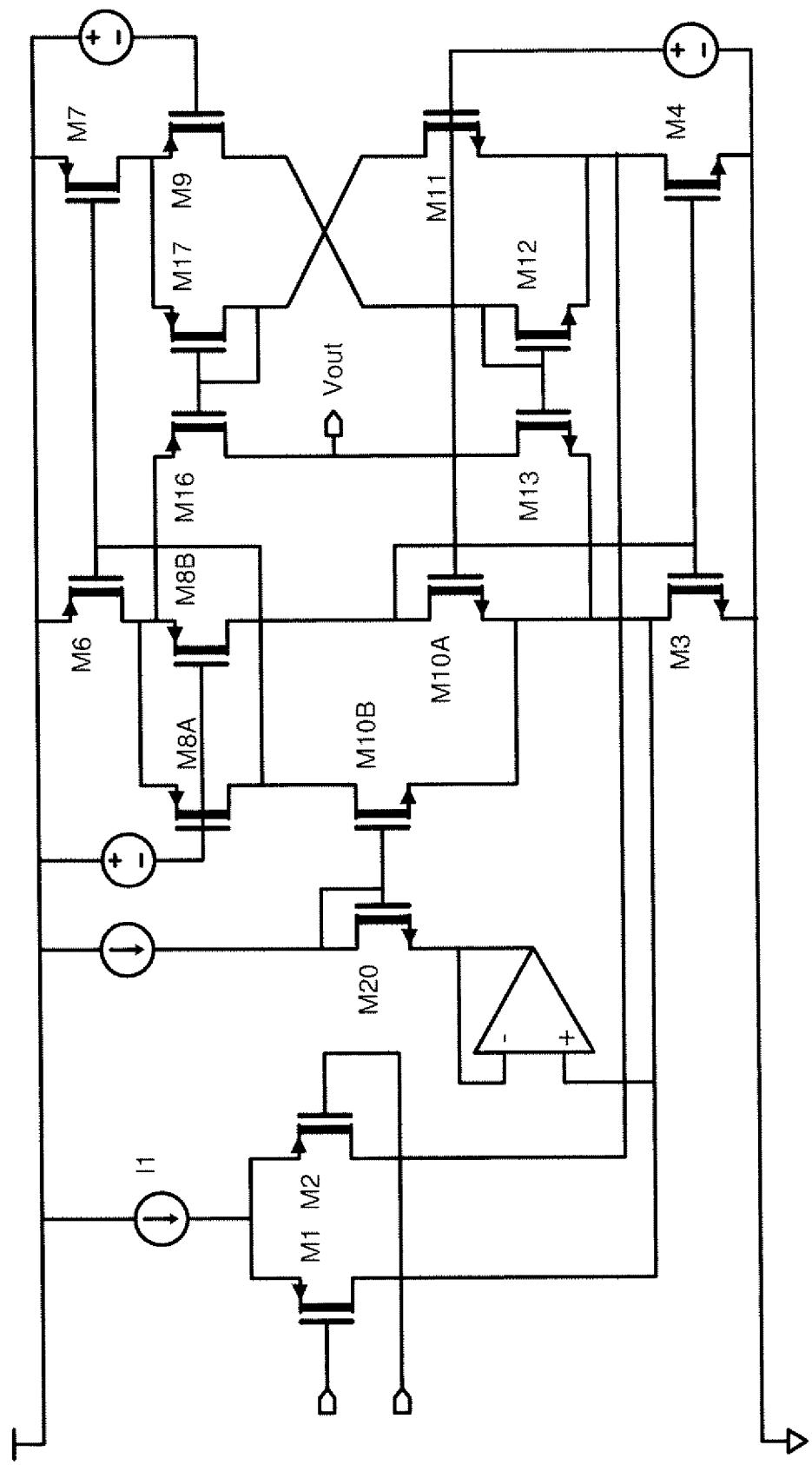
Figure 6C:
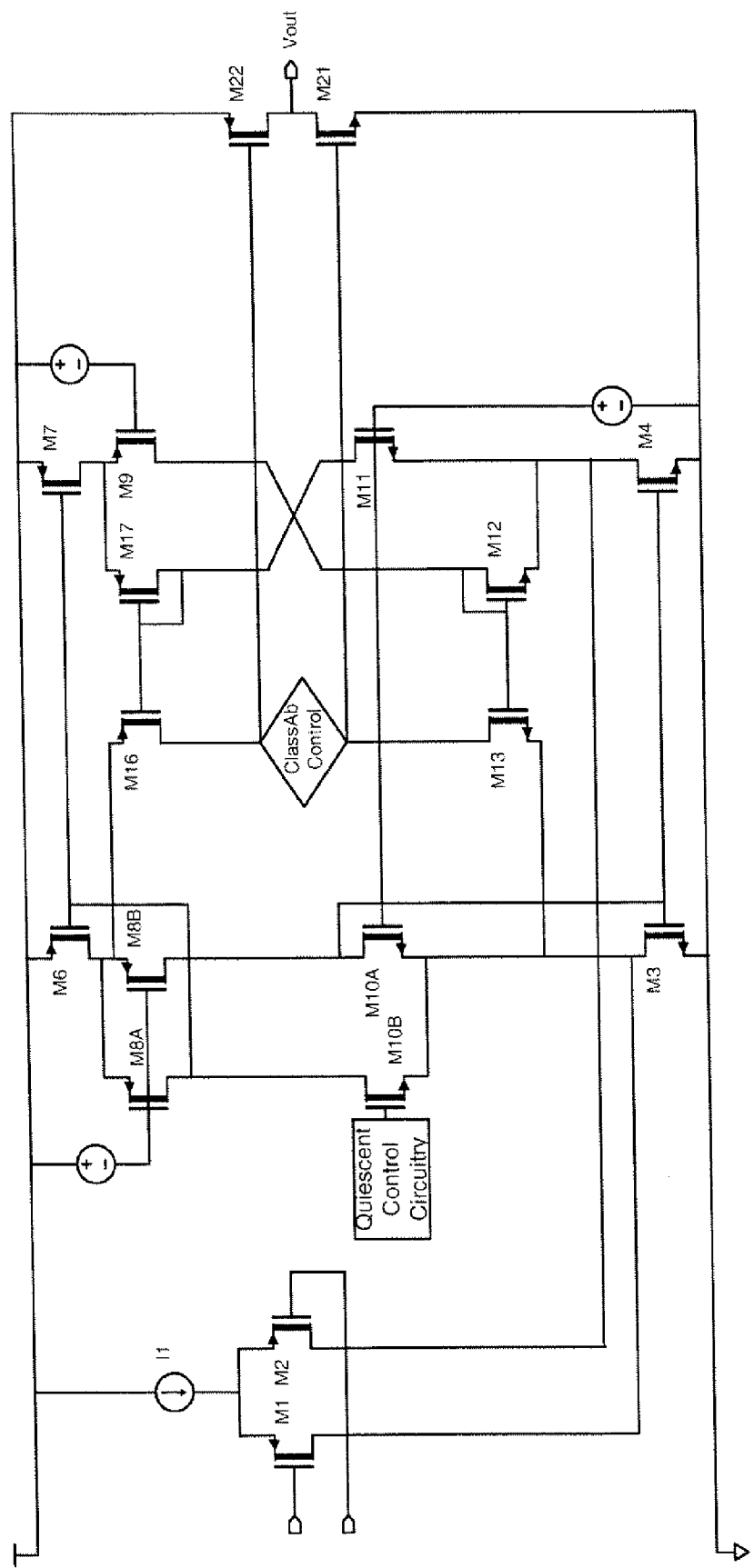
Figure 6D:
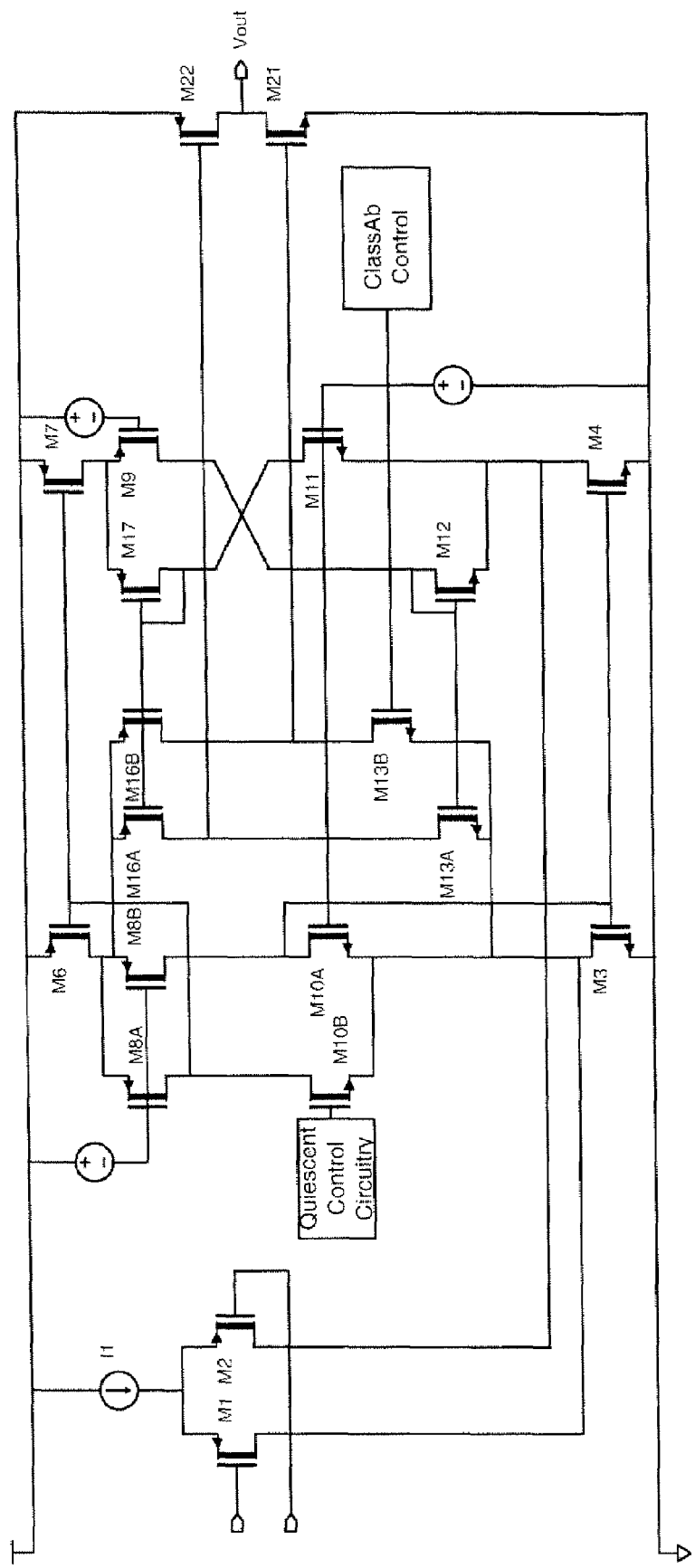
Figure 6E:
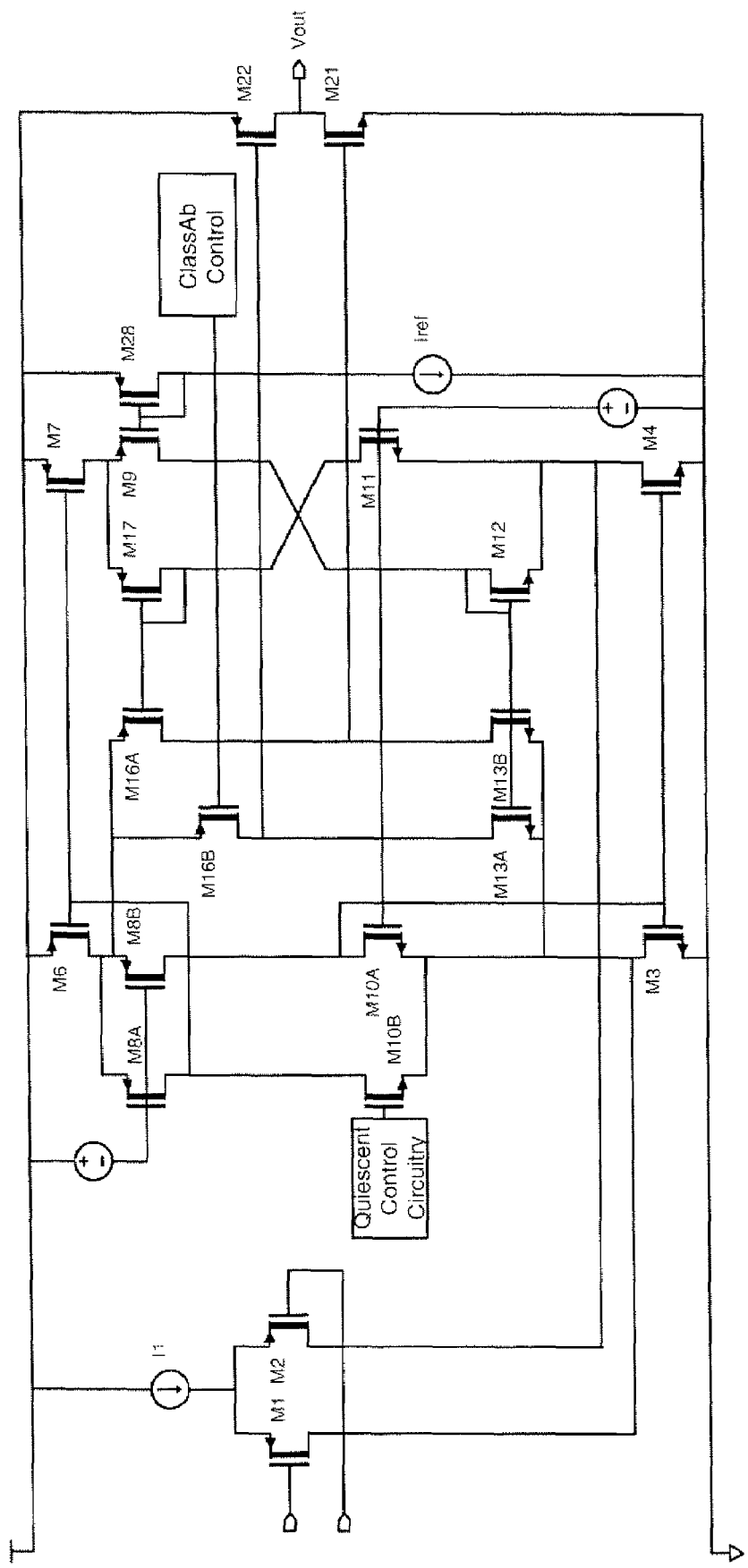
Figure 6F:
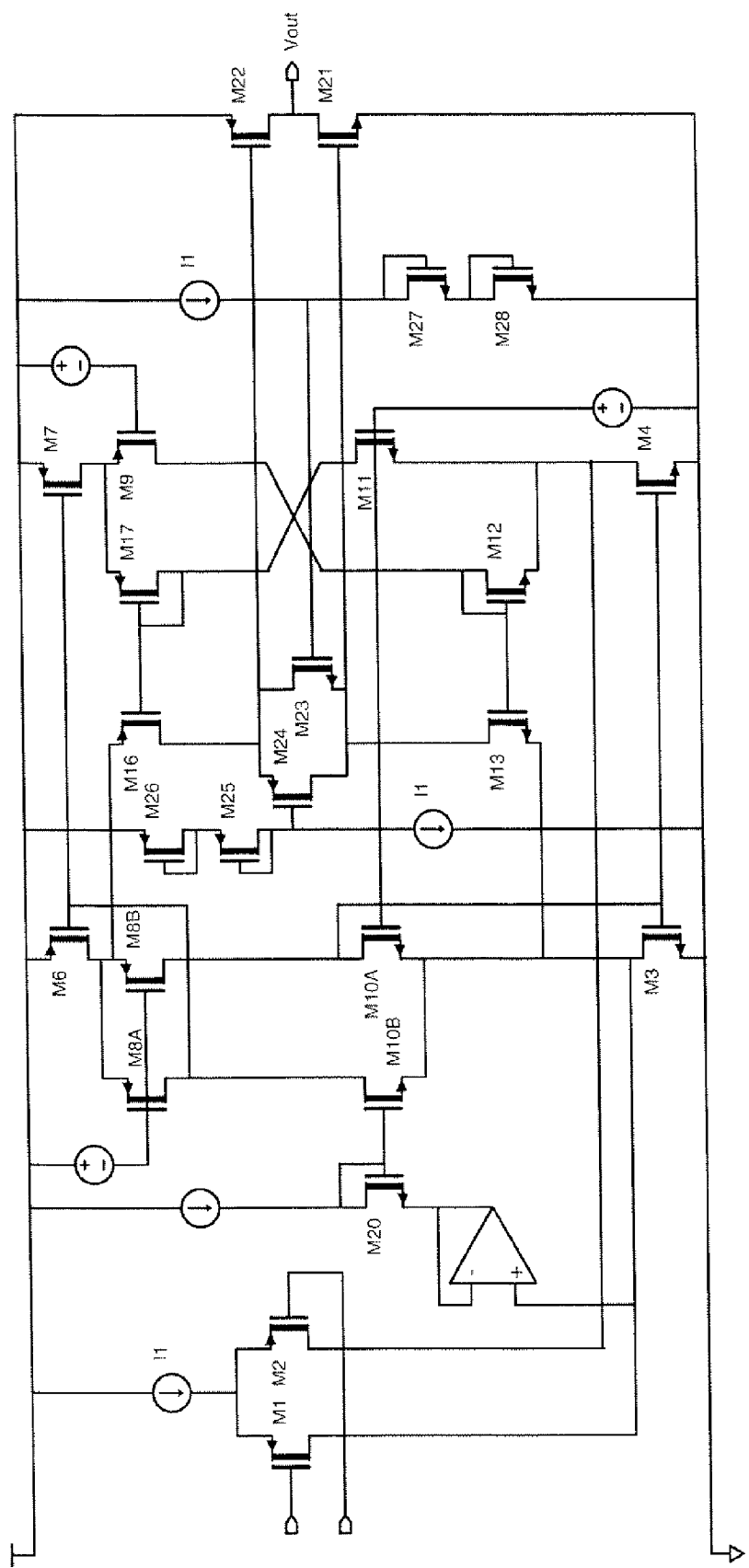
Figure 6G:
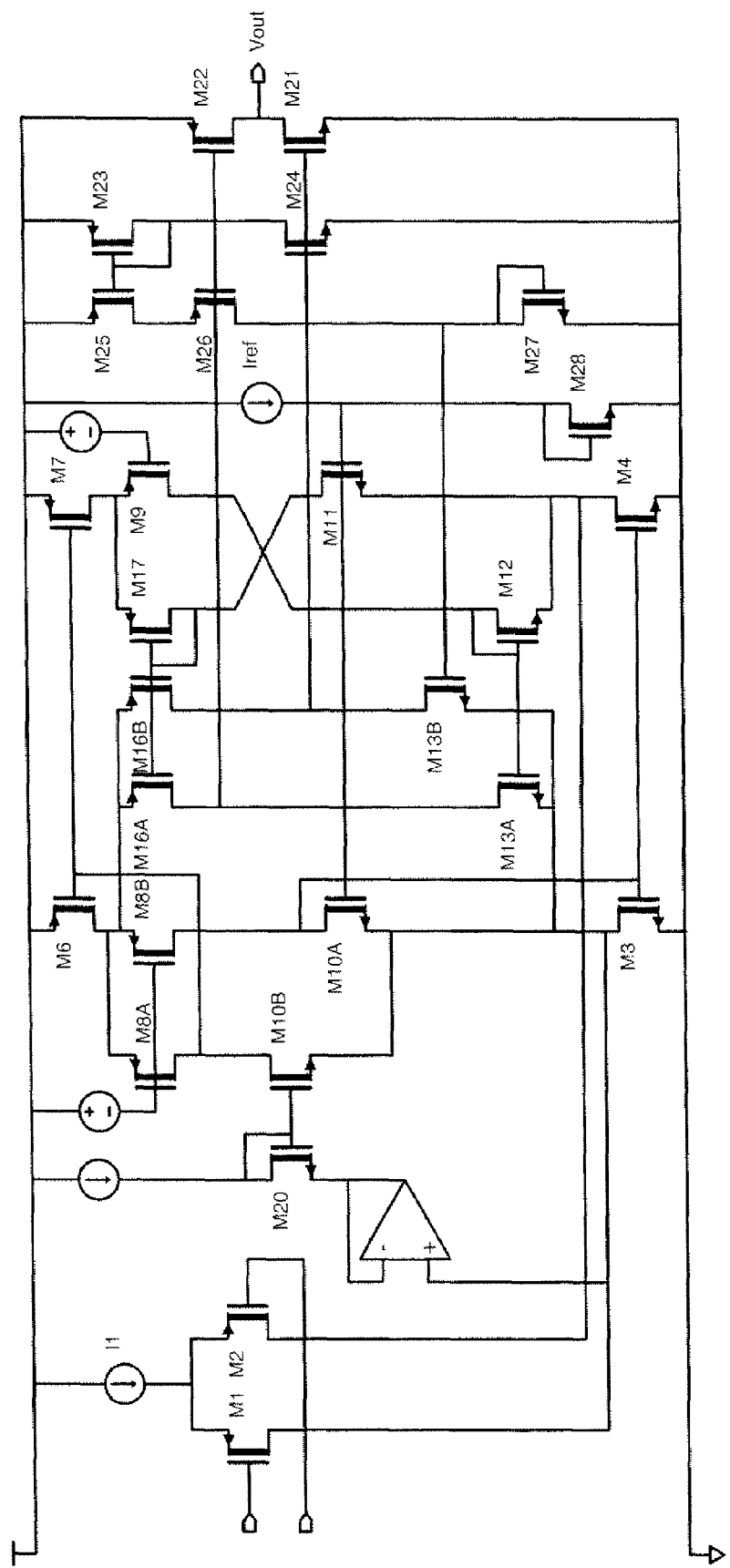
Figure 6H:
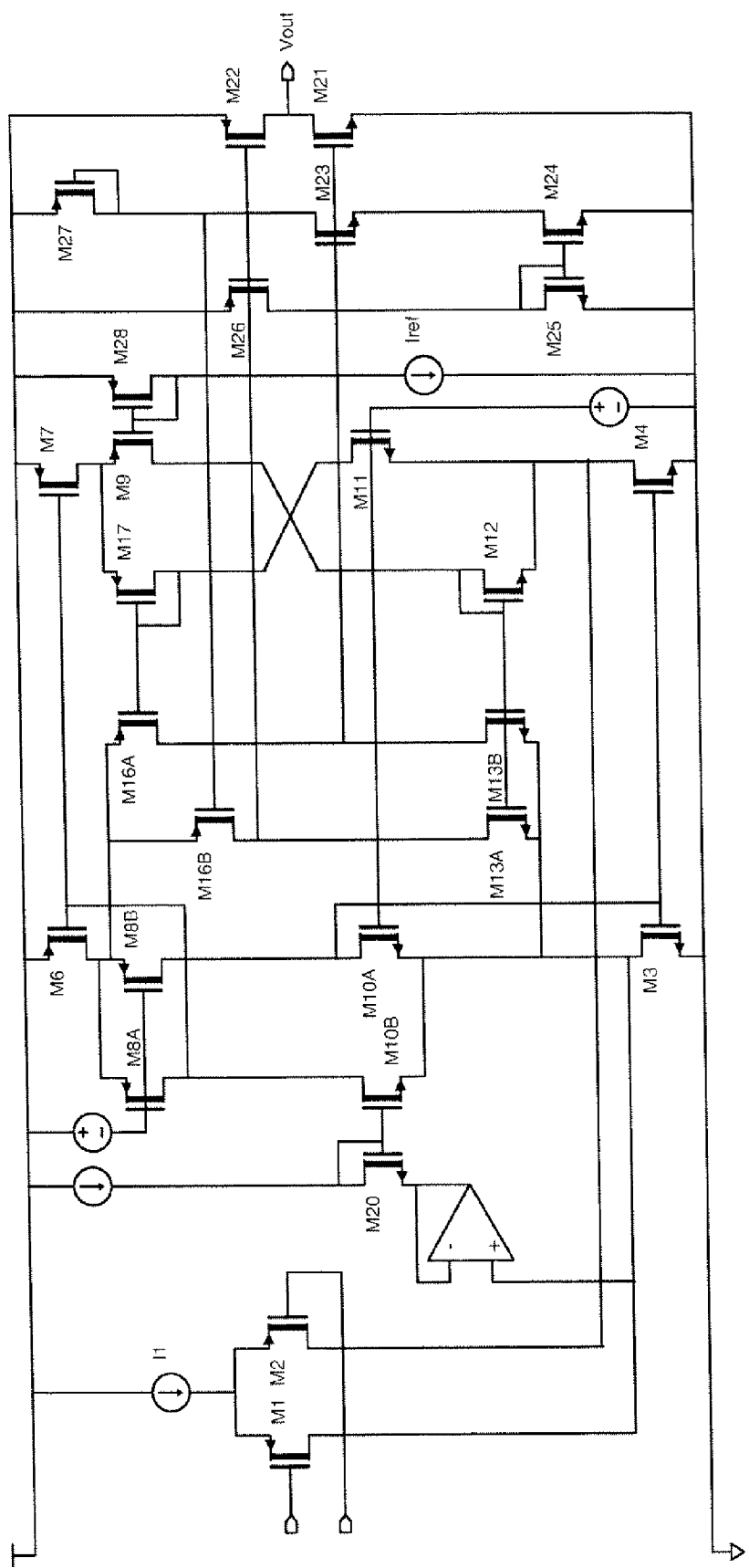

The folding stage in FIG. 6a can be seen as a bottom half containing 2 stacked mirrors M3M4, M12M13 and a top half containing 2 stacked mirrors M6M7 and M16M17. As the mirrors operate independent from each other, 3 other circuit configurations are possible as drawn in FIGS. 7a, 8a and 9a. The quiescent control circuitry in all the circuits can be just a current source and mirroring transistor M20, as shown in FIGS. 6b and 6f-6h.

Figure 7A:
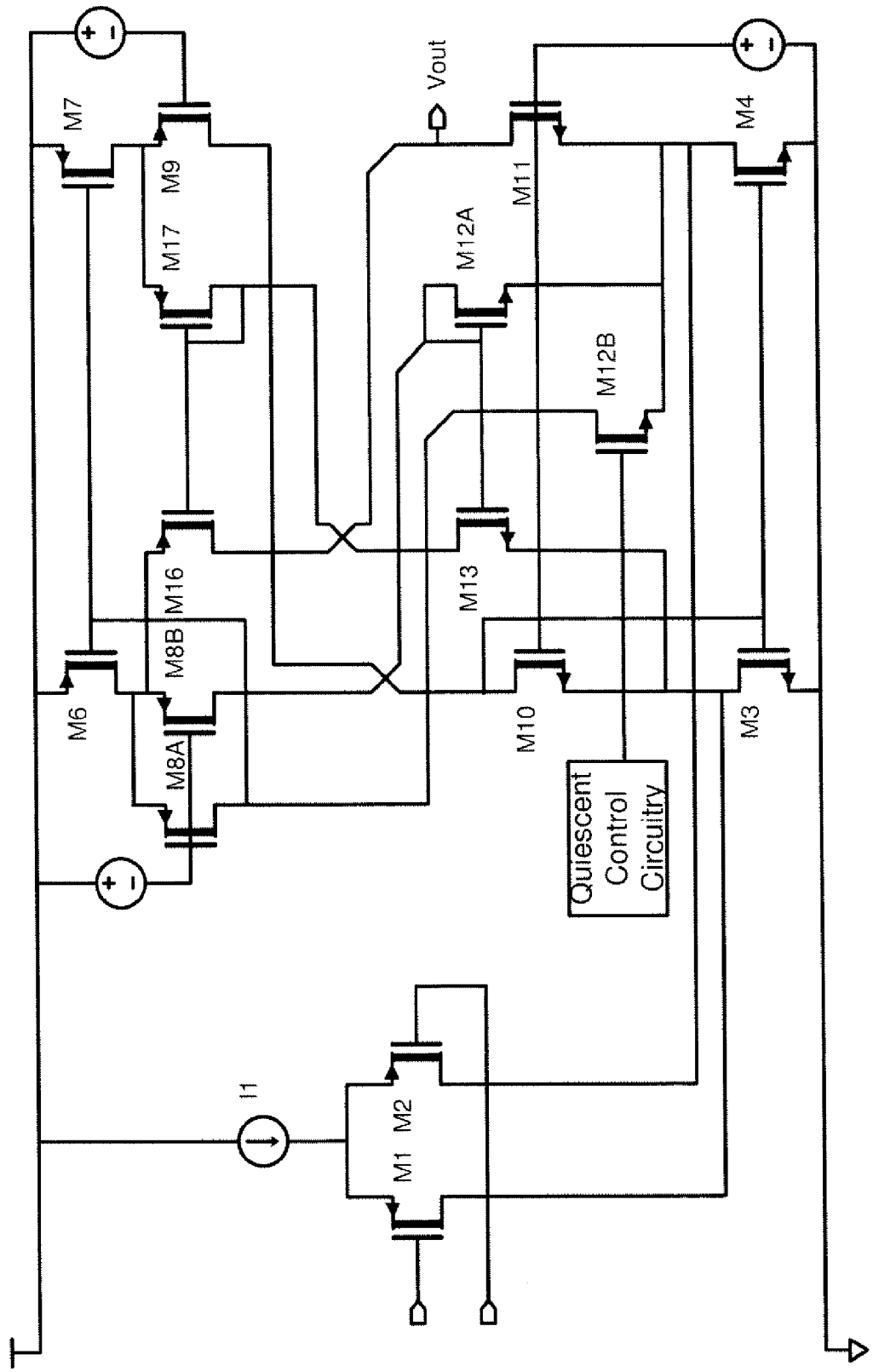
FIG. 7a-7d illustrate further embodiments having a folding stage as a bottom half containing 2 stacked mirrors and a top half containing 2 stacked mirrors, and further illustrating a class AB output stage with various output stage drivers.
Figure 7B:
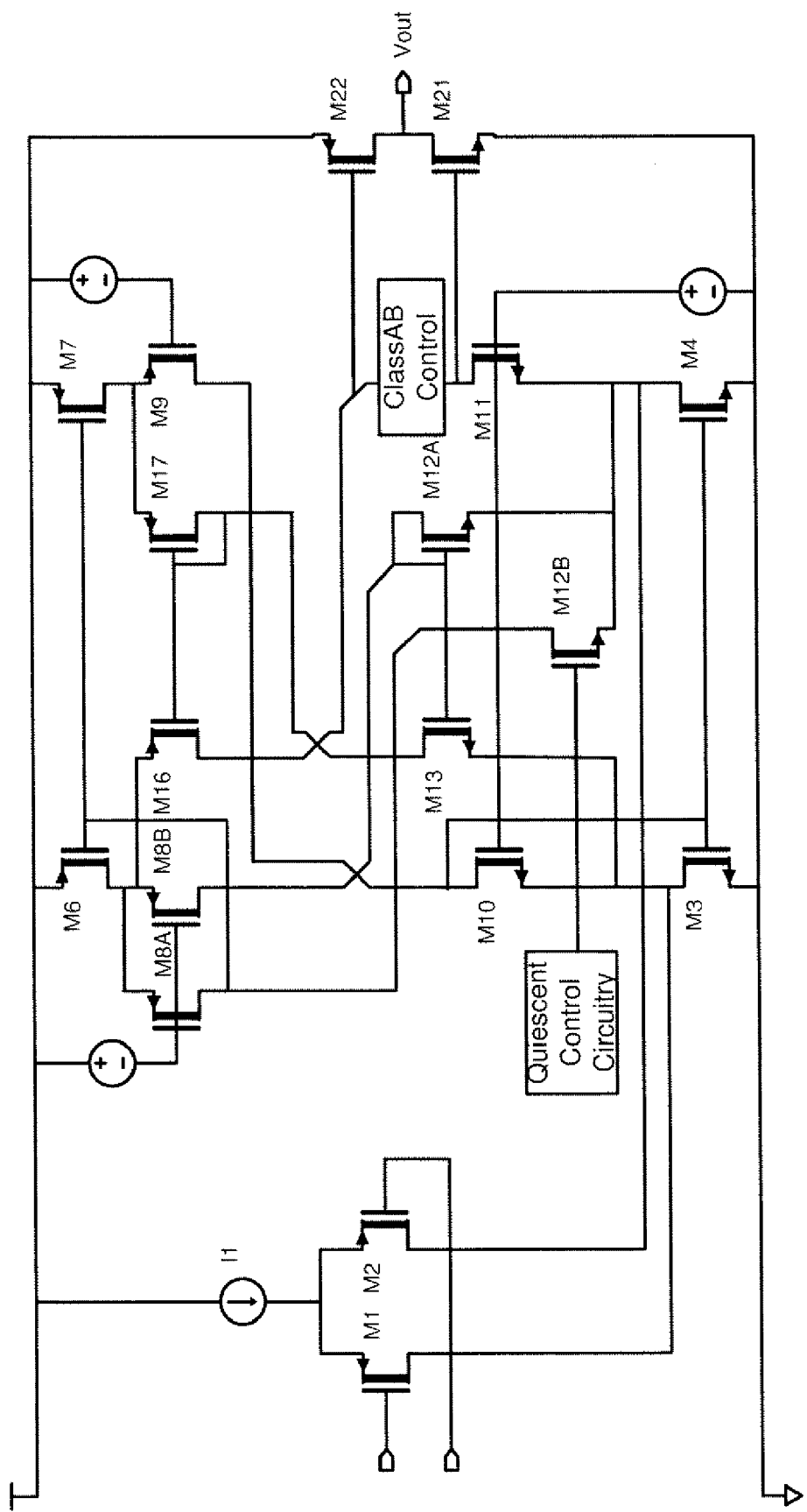
Figure 7C:
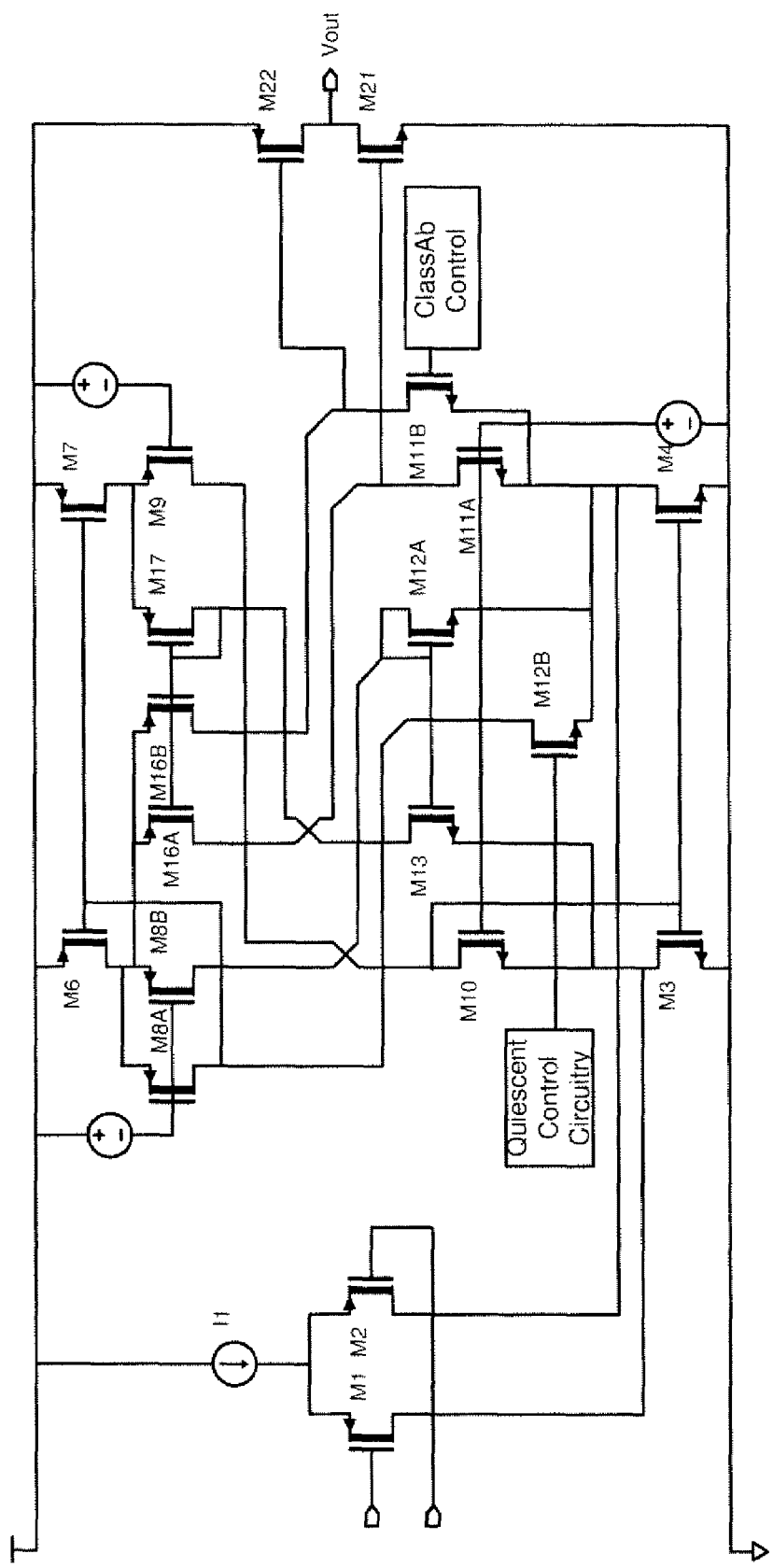
Figure 7D:
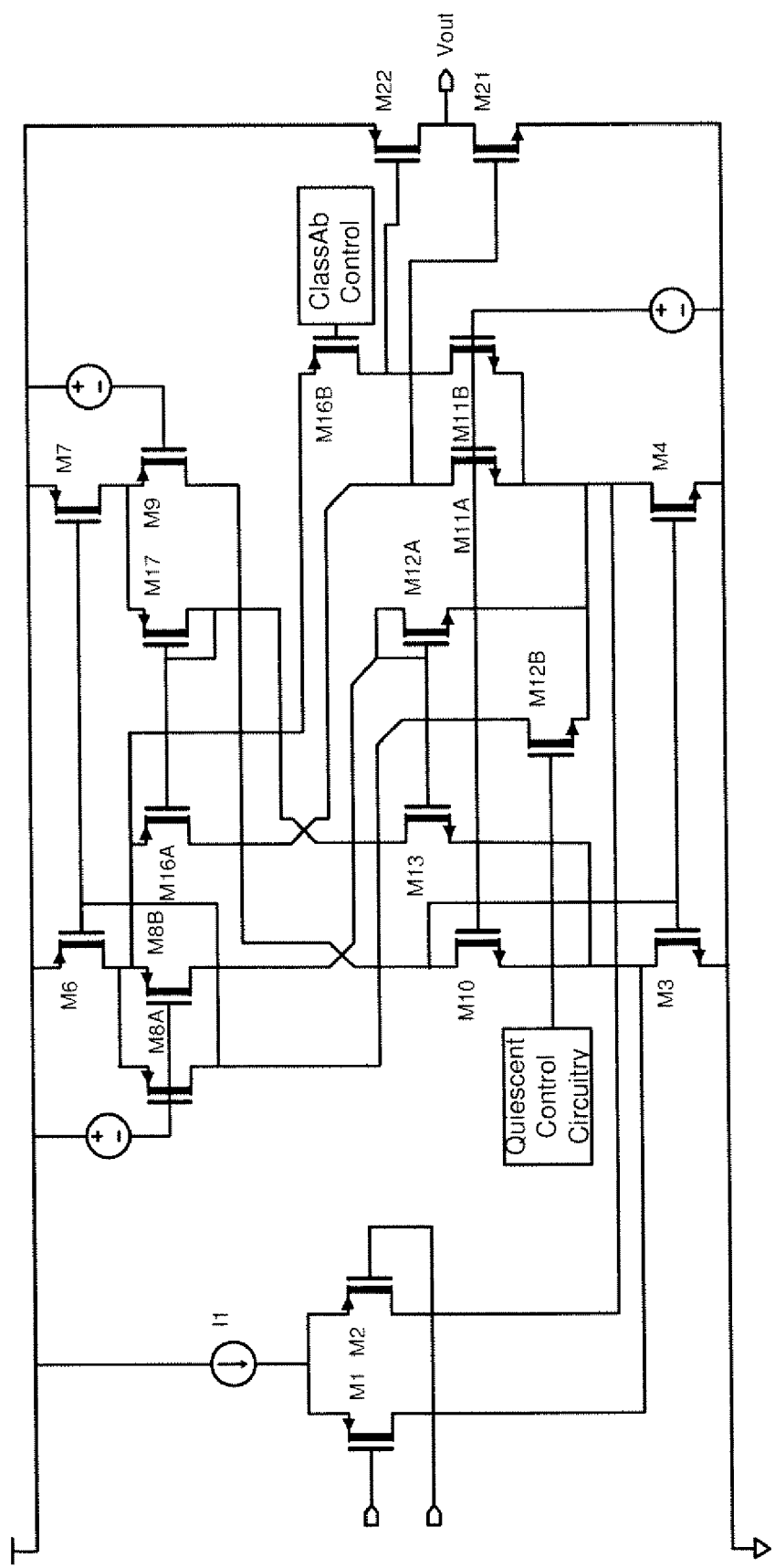
Figure 8A:
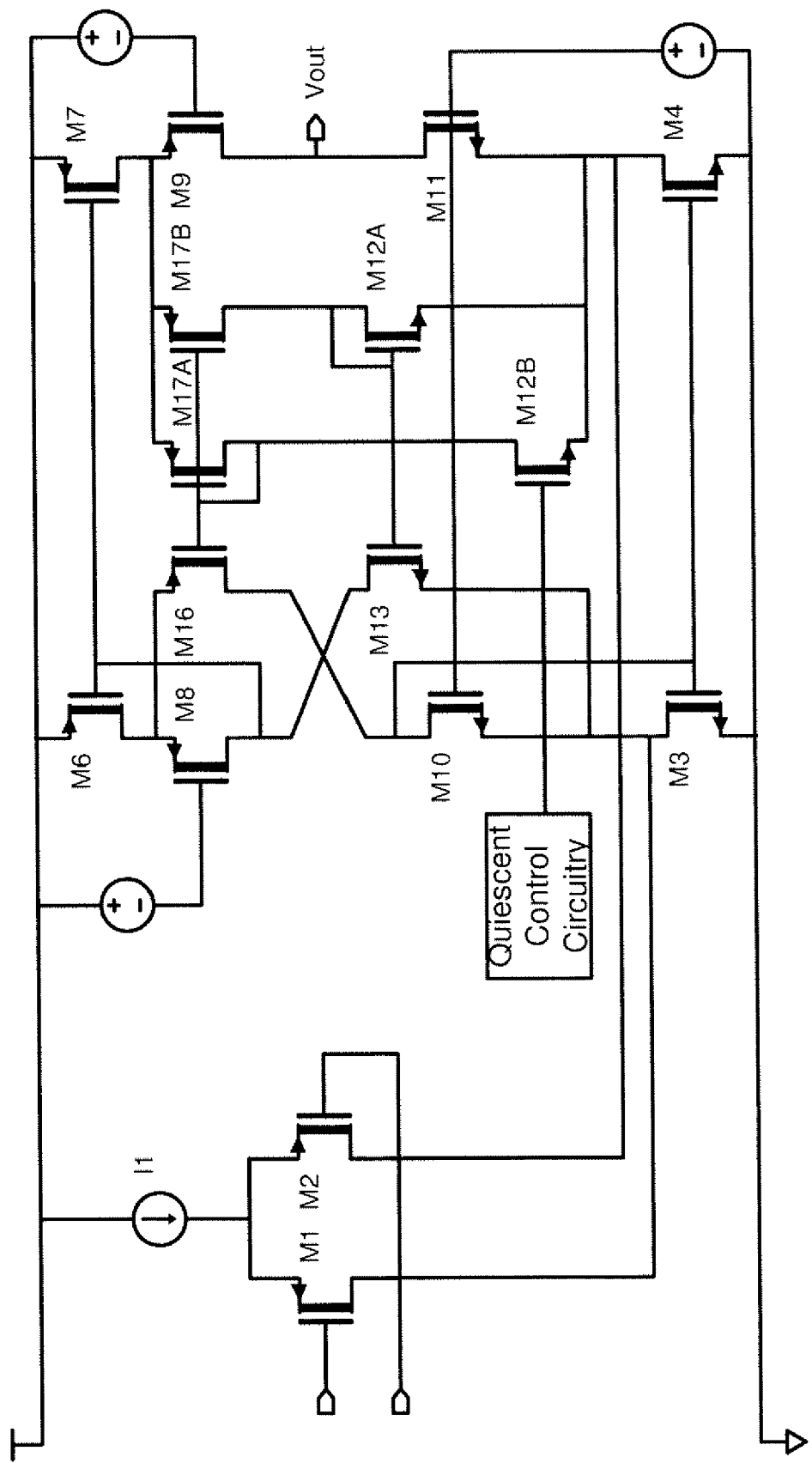
FIG. 8a-8d illustrate still further embodiments having a folding stage as a bottom half containing 2 stacked mirrors and a top half containing 2 stacked mirrors, and further illustrating a class AB output stage with various output stage drivers.
Figure 8B:
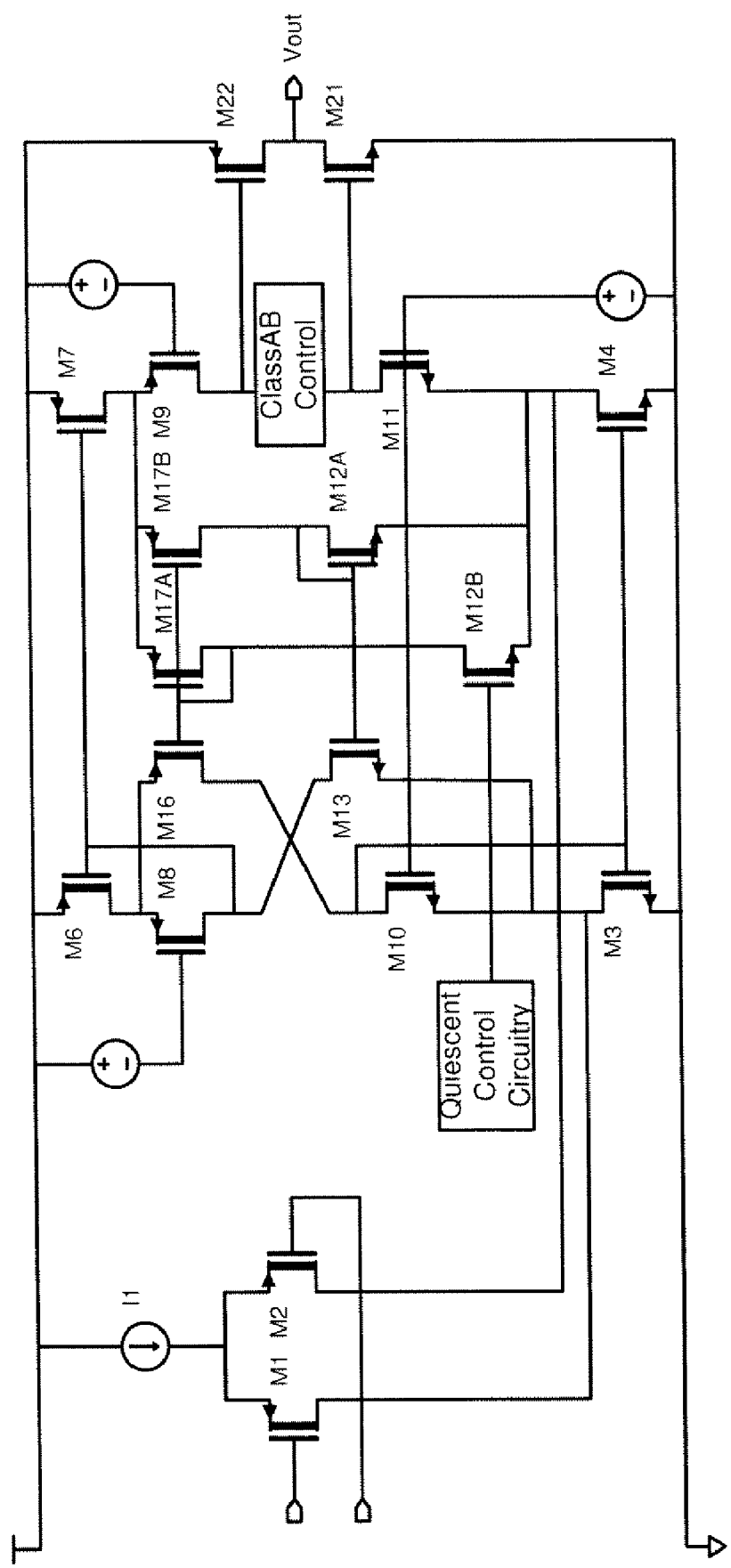
Figure 8C:
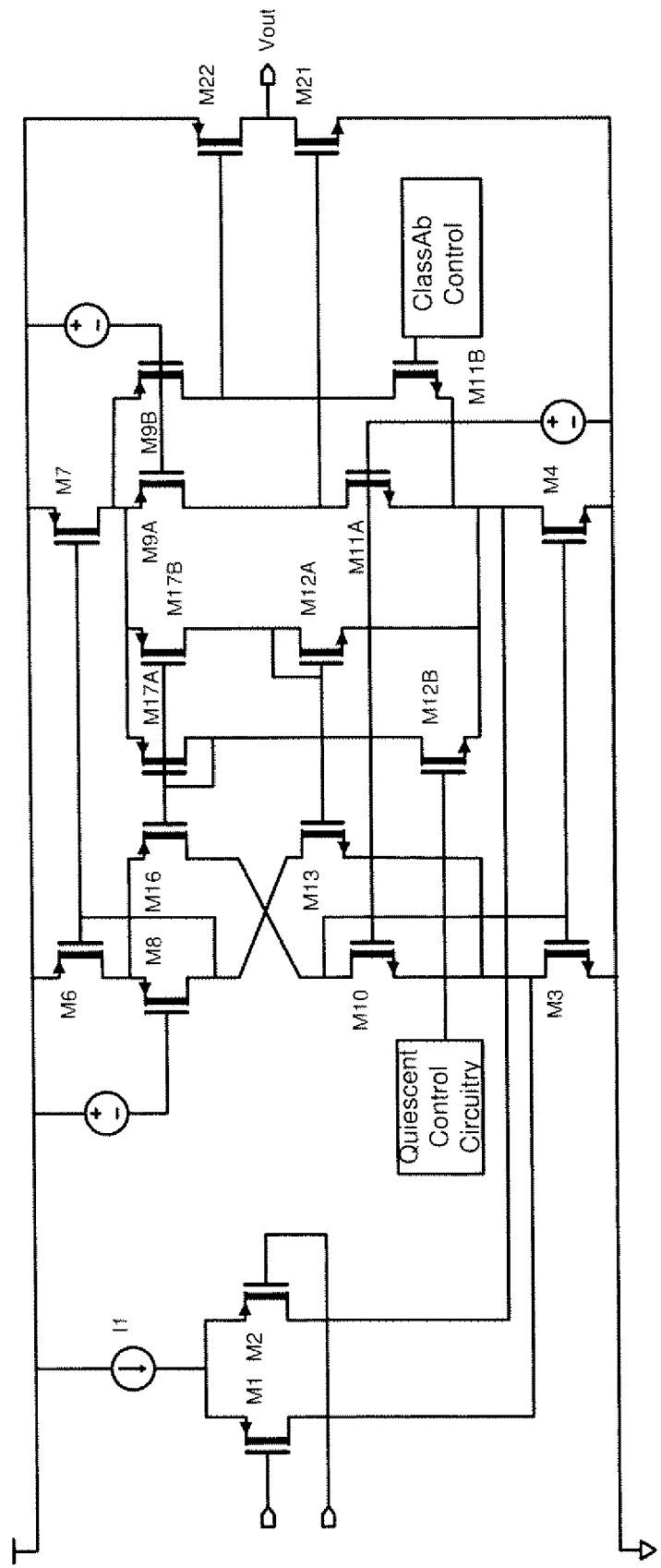
Figure 8D:
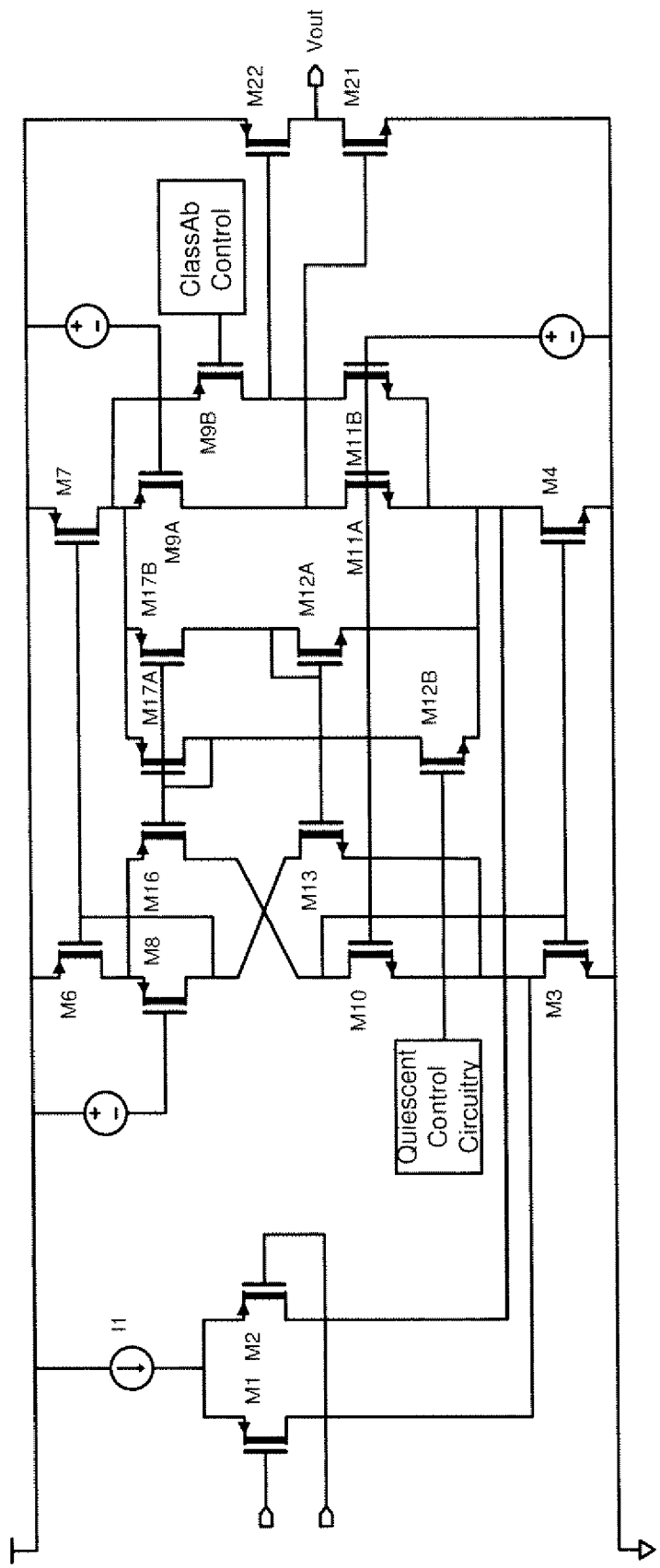
Figure 9A:
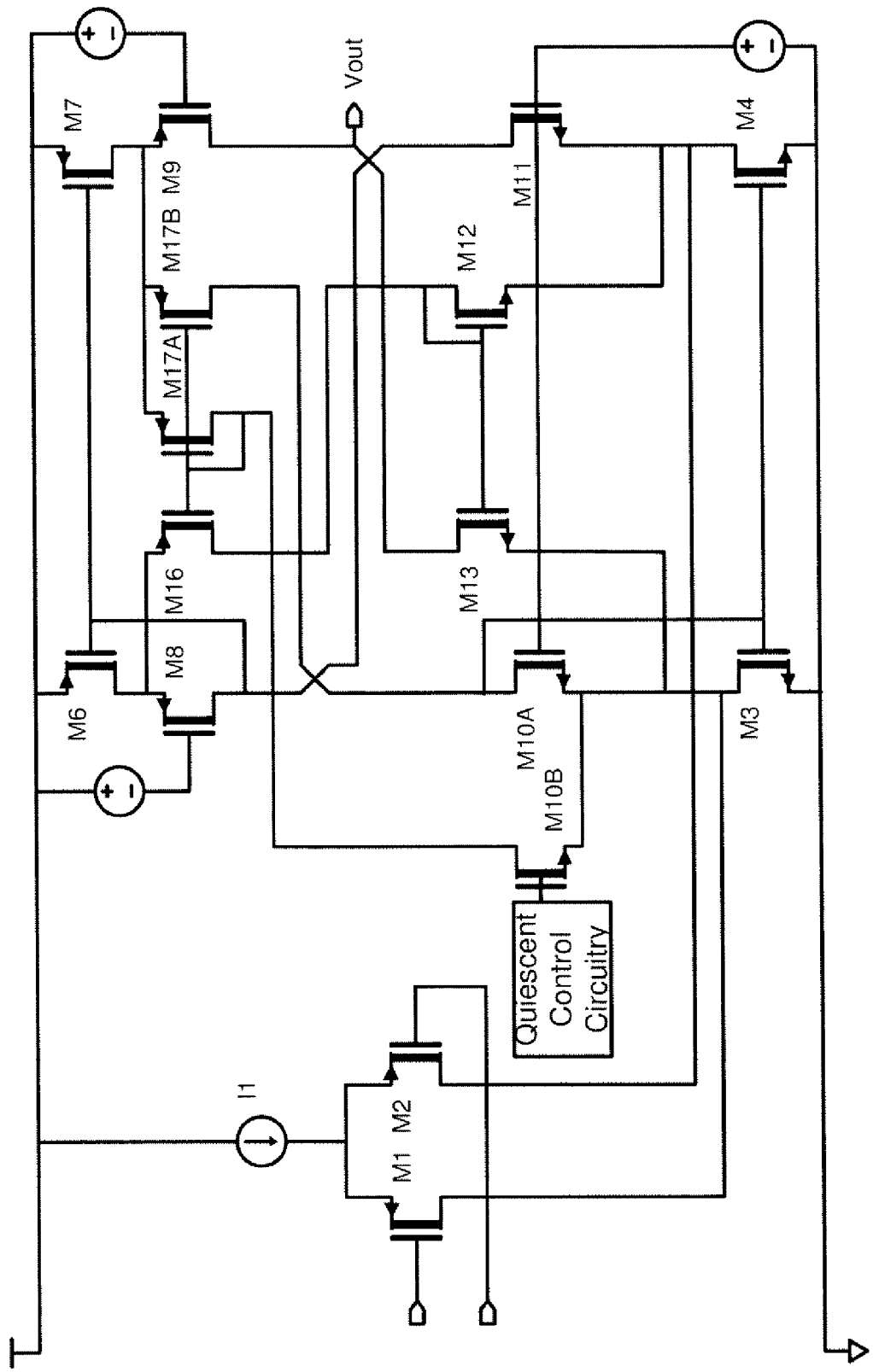
FIG. 9a-9d illustrate still further embodiments having a folding stage as a bottom half containing 2 stacked mirrors and a top half containing 2 stacked mirrors, and further illustrating a class AB output stage with various output stage drivers.
Figure 9B:
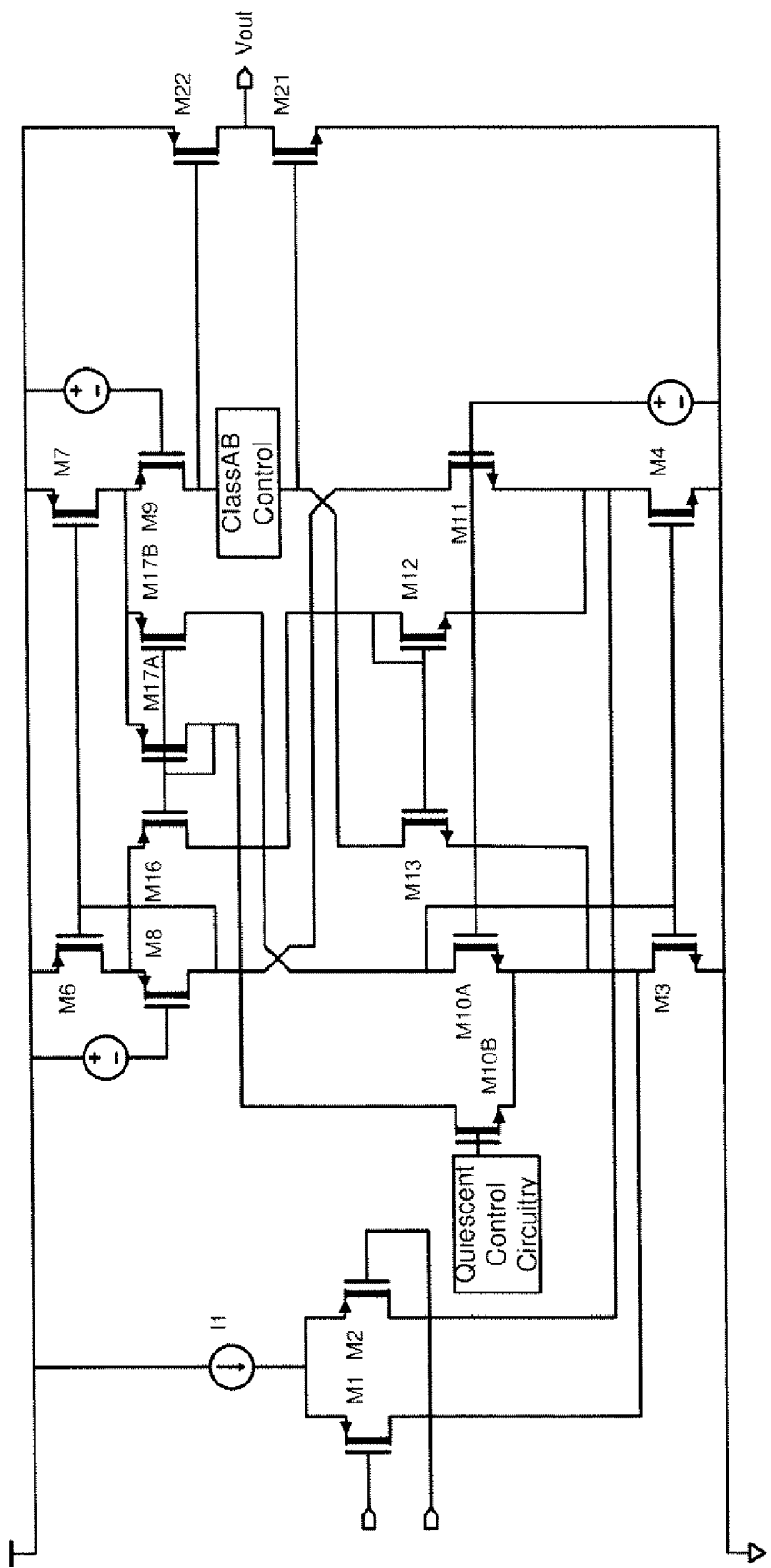
Figure 9C:
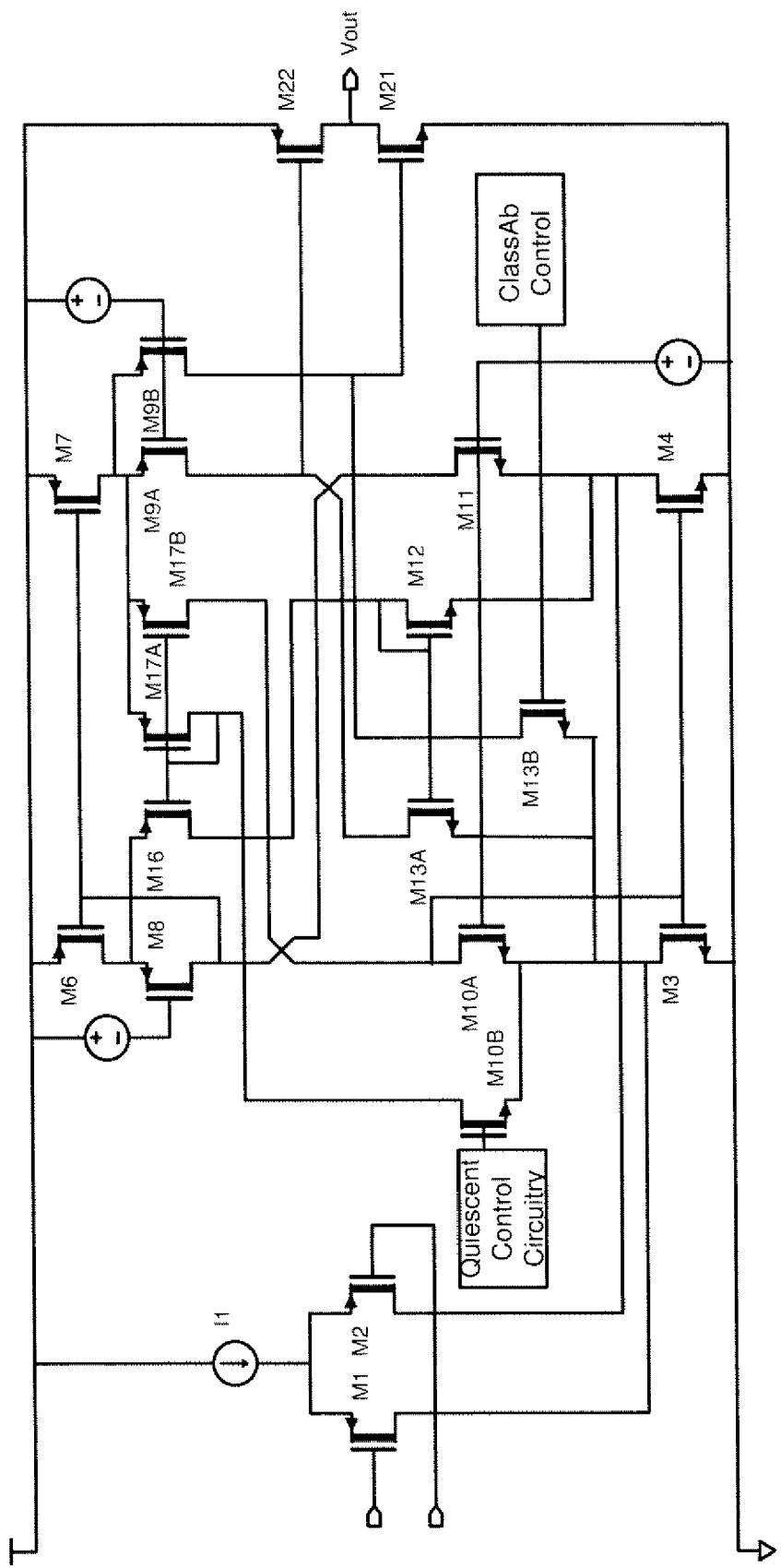
Figure 9D:
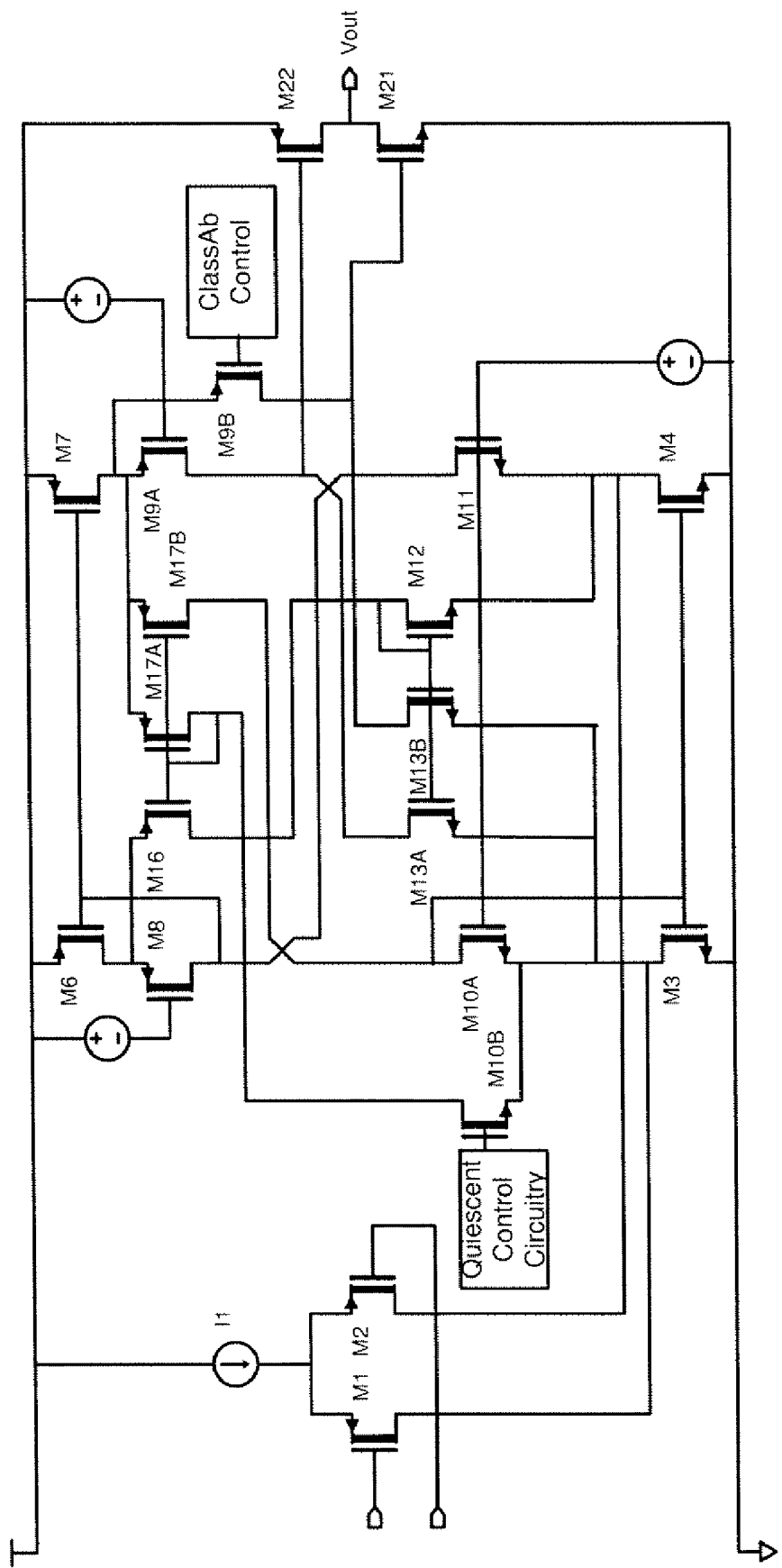

FIGS. 7a, 8a and 9a show the differential input stage and the intermediate stage of a class AB amplifier incorporating the invention. While these Figures suggest a single ended output of the intermediate stage, FIGS. 6c-6e, 6g, 6h, 7c-7d, 8c-8d and 9c-9d illustrate the application of the present invention in embodiments having a pair of outputs for driving the pull-up and pull-down transistors M22 and M21. The class AB control shown in these Figures is well known and not described in detail herein.

It will be noted that all embodiments utilize what has been referred to herein as upper and lower nested current mirrors. These basic circuits are shown in FIGS. 10*a* and 10*b*, and 10*c* and 10*d*, respectively, and are labeled as in FIGS. 6*a*, 7*a*, 8*a* and 9*a*. While FIGS. 10*a* and 10*b* appear slightly different than the Figures they are taken from, they are simply drawn slightly differently, but are the same circuits.

Figure 10A:
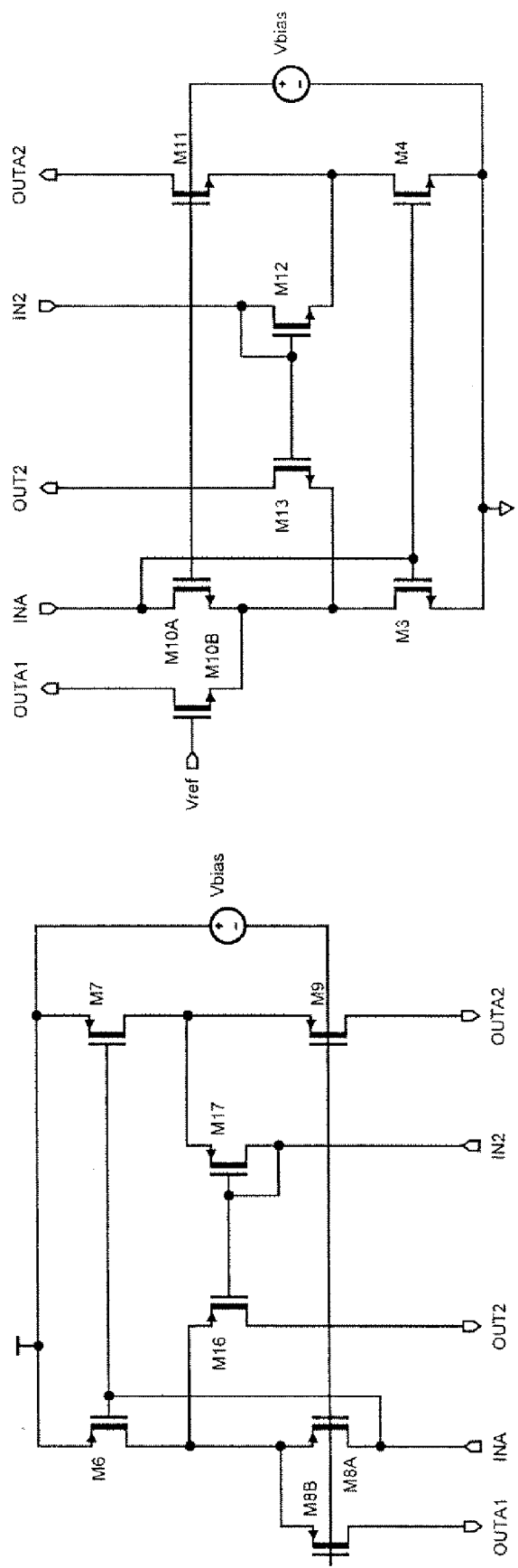
FIGS. 10a and 10d illustrate four basic pairs of upper and lower nested current mirrors of the present invention.
Figure 10B:
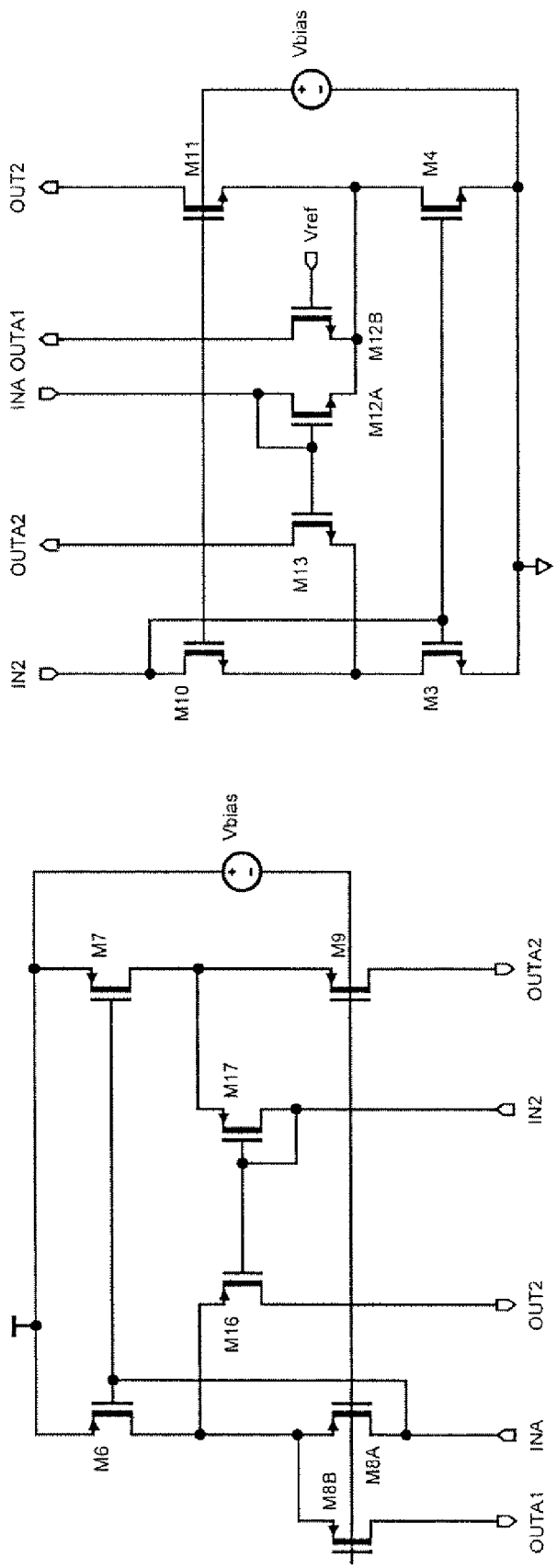
Figure 10C:
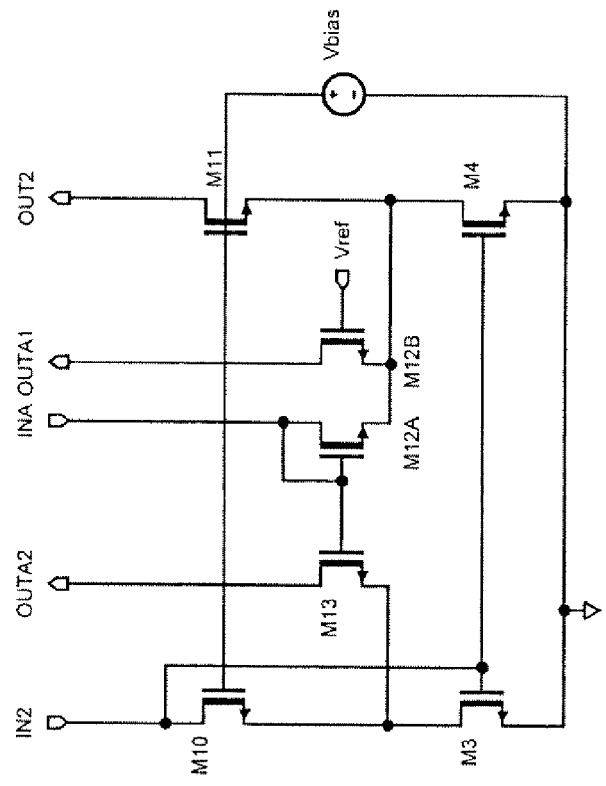
Figure 10C:
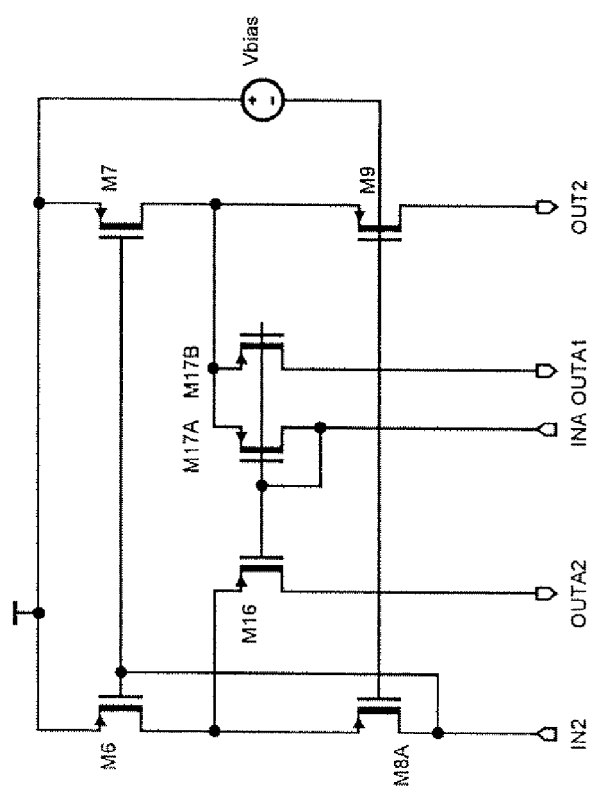
Figure 10D:
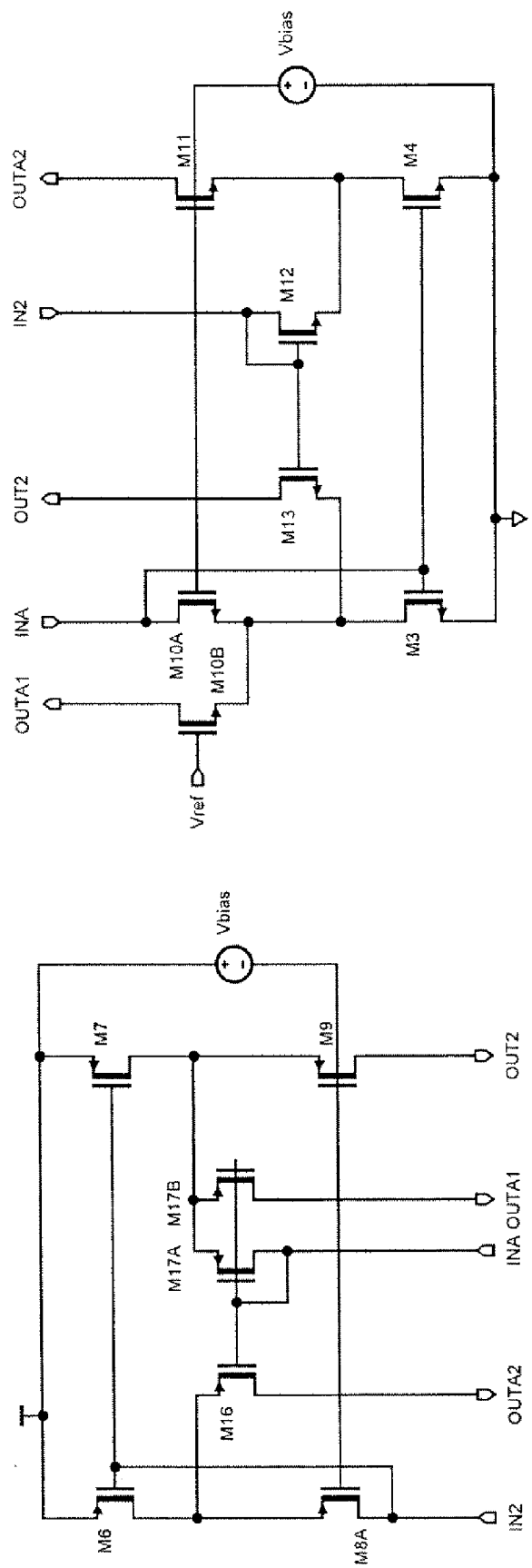
Figure 13A:
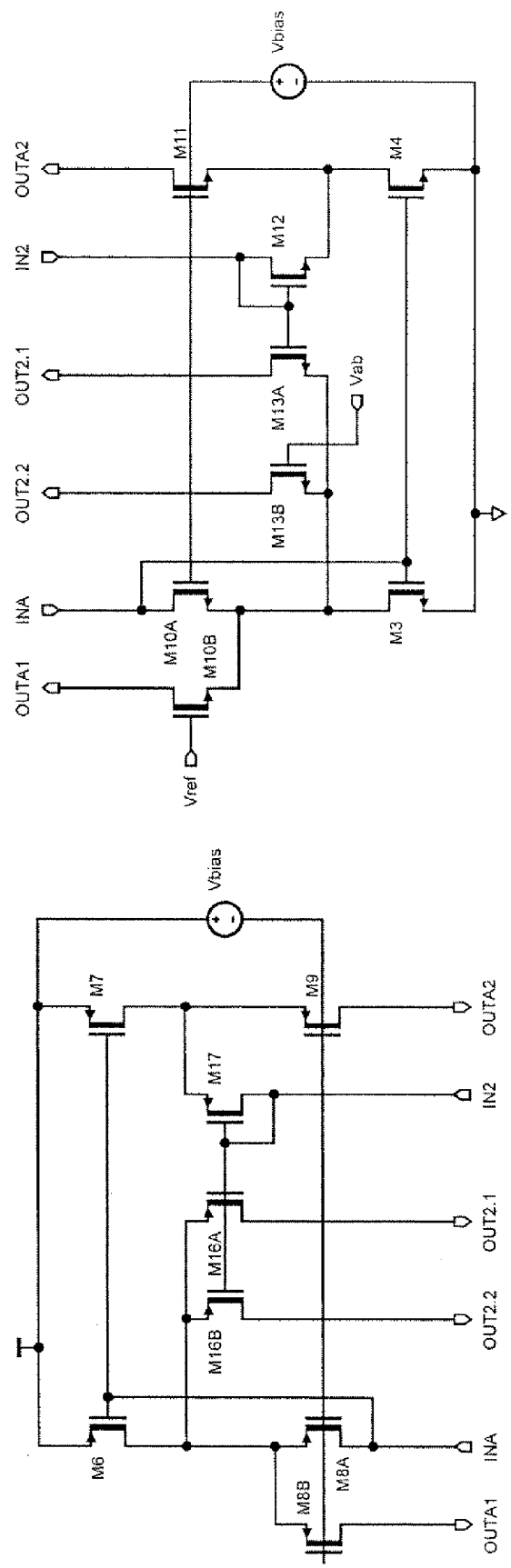
FIGS. 13a-13h illustrate 8 embodiments having upper and lower nested current mirrors with split output transistors.
Figure 13B:
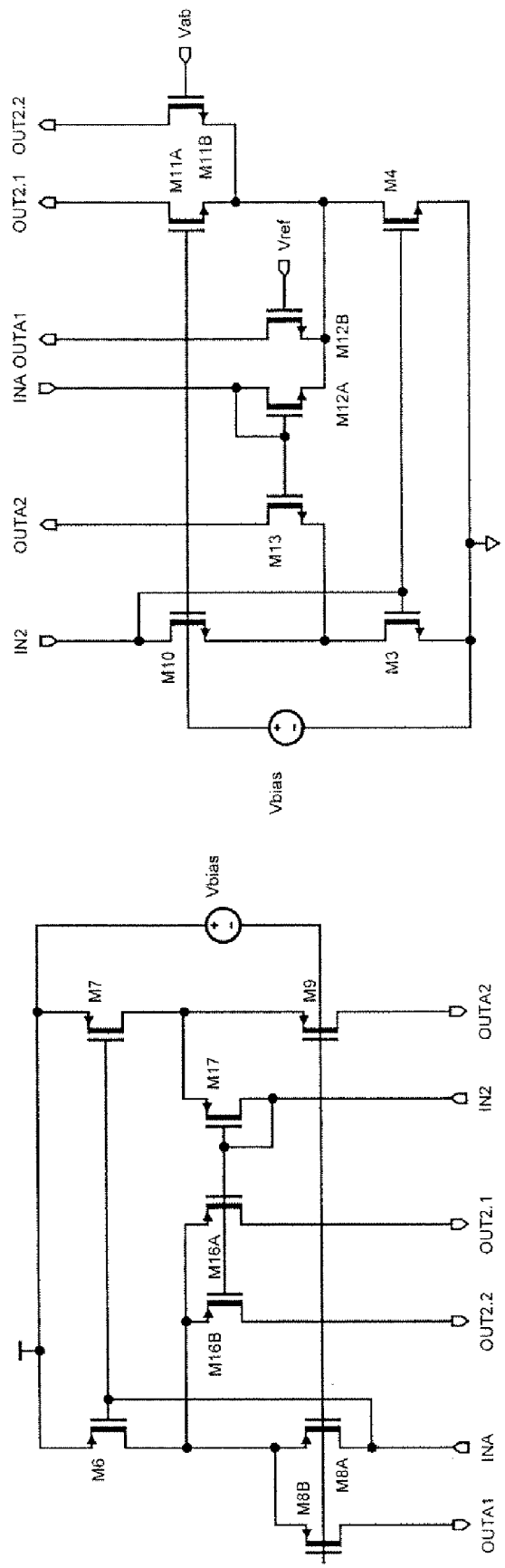
Figure 13C:
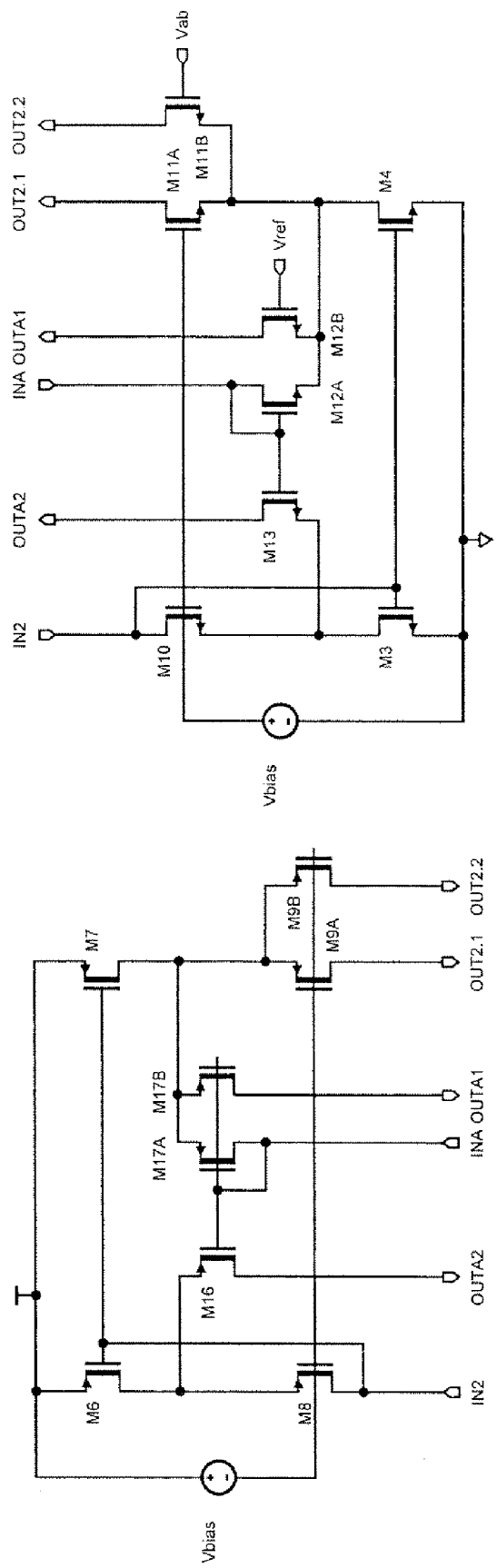
Figure 13D:
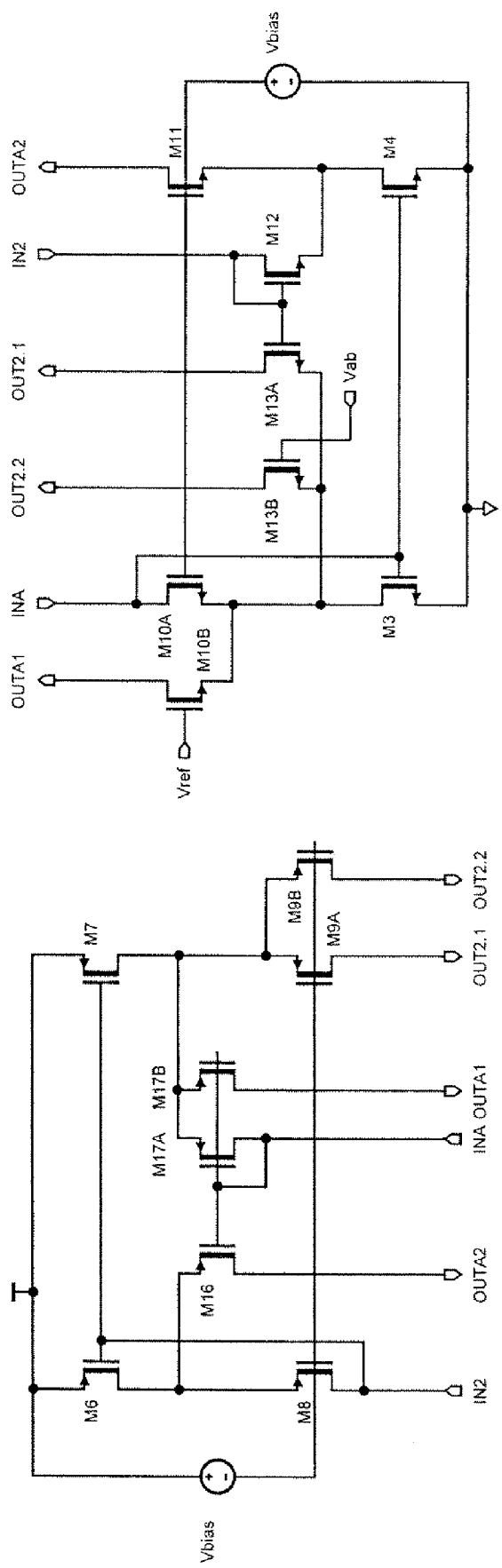
Figure 13E:
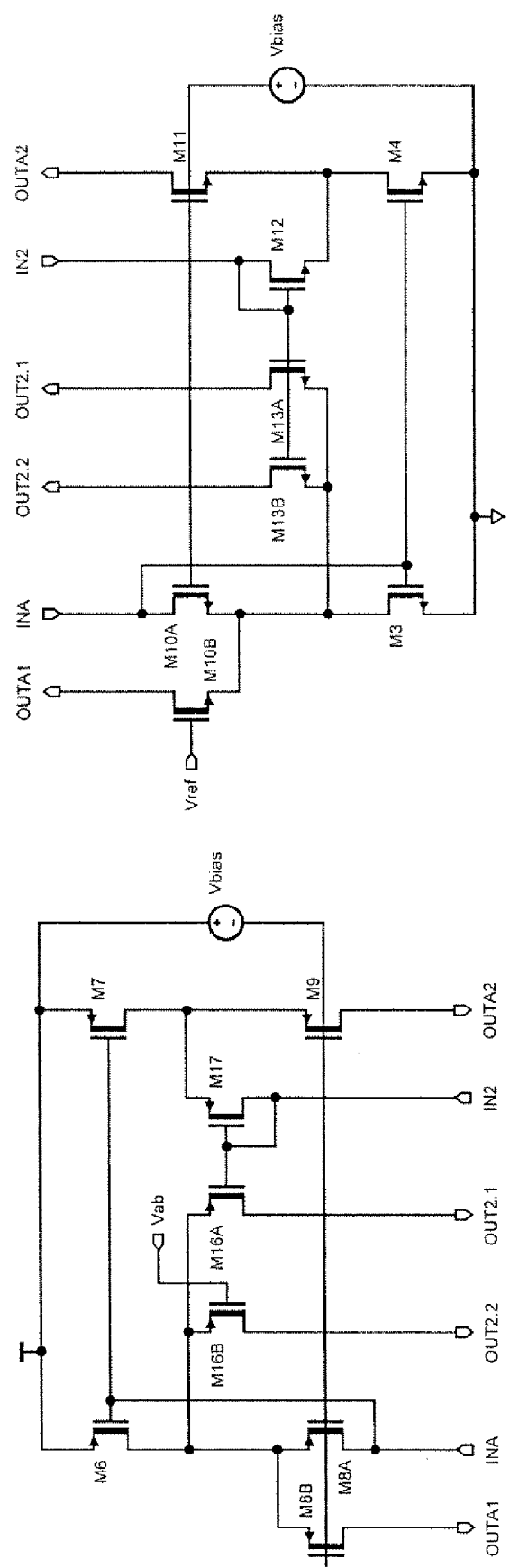
Figure 13F:
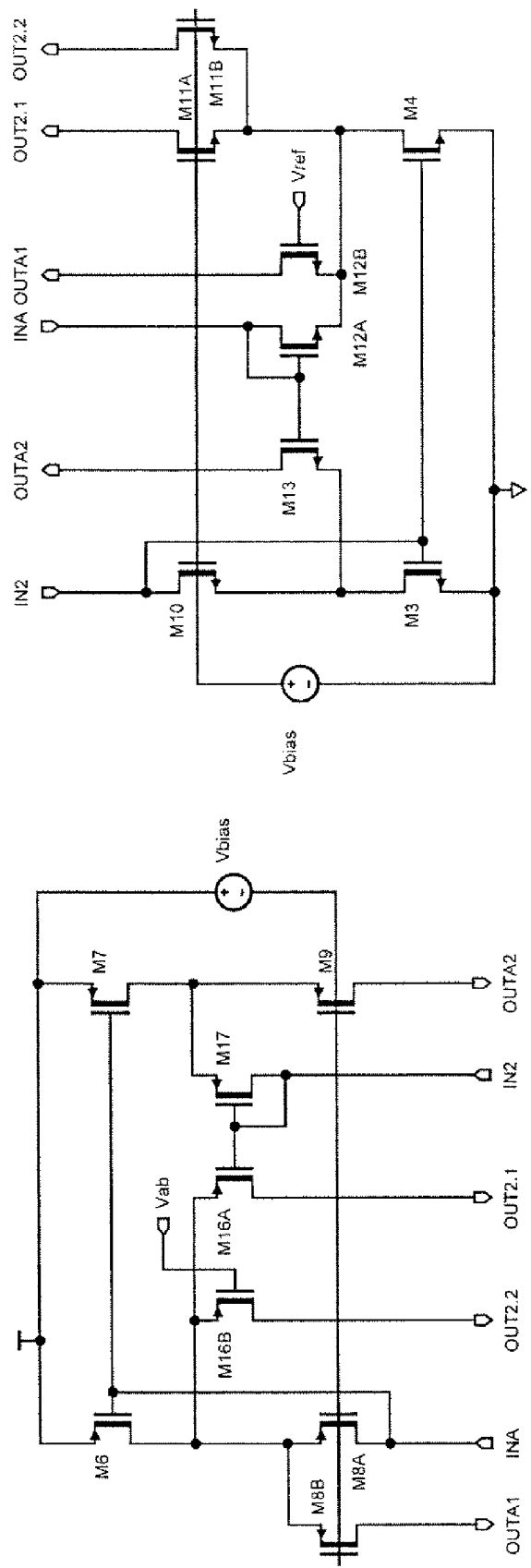
Figure 13G:
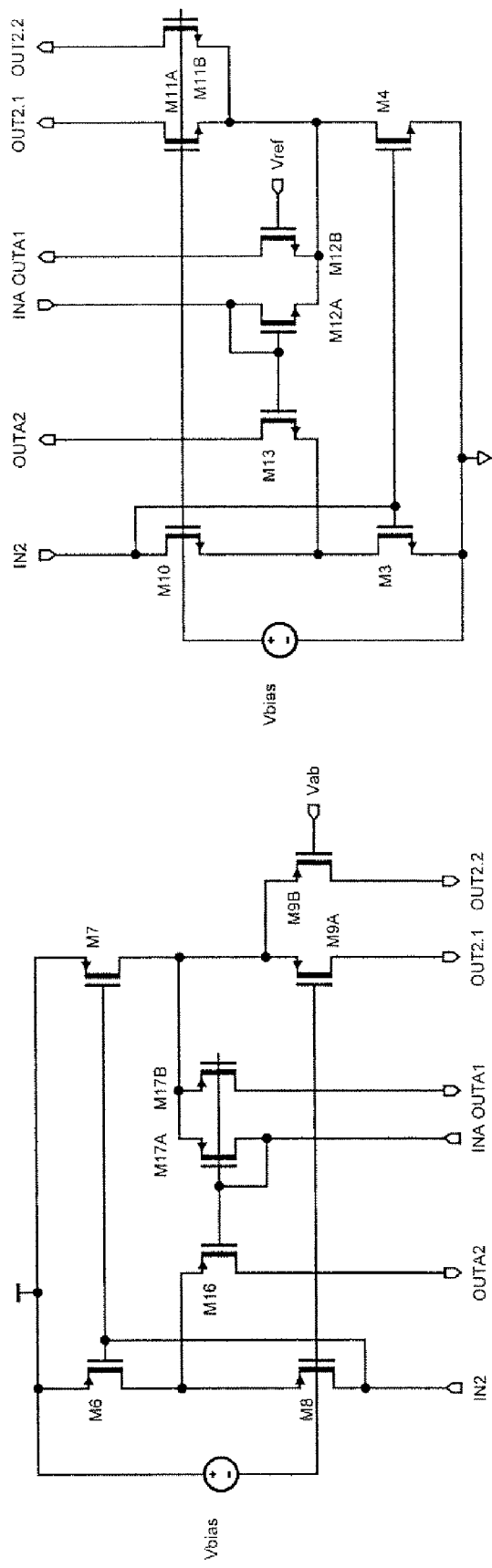
Figure 13H:
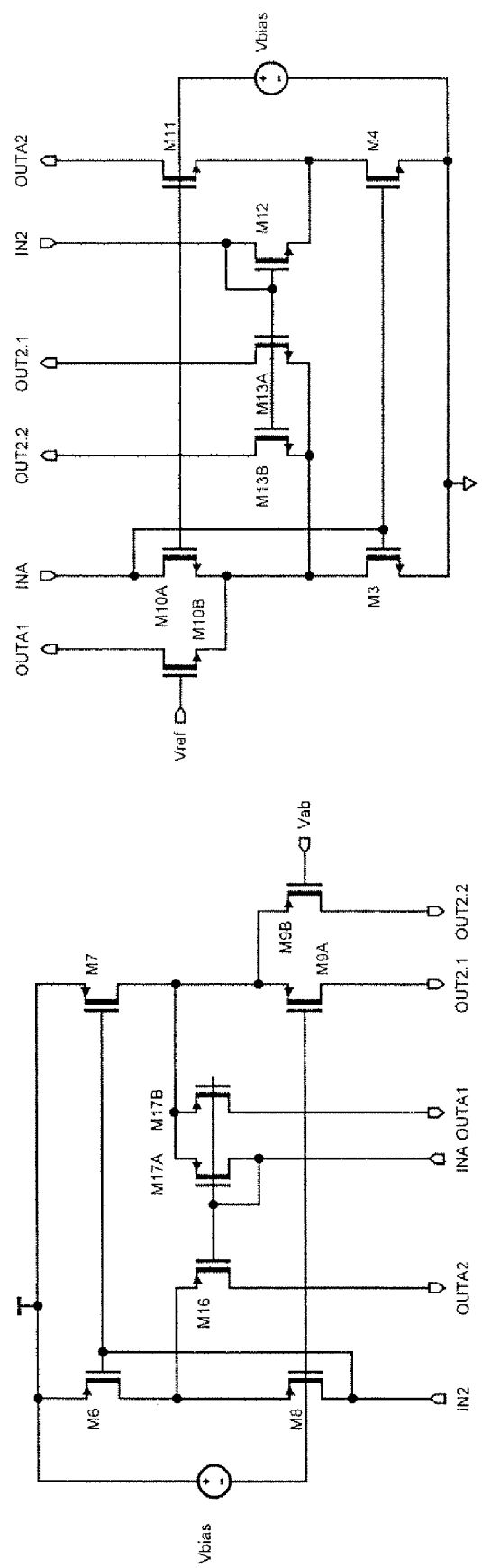

Referring first to FIG. 10*a*, it will be noted that Transistors M6 and M7 are connected as a mirror by way of their connection to transistors M8A and M9. Also because the cascode connection of transistors M8A and M9, the voltages on the drains of transistors M6 and M7, and thus the voltages of the sources of M16 and M17, are substantially equal, so that the current mirror M16,M17 operates substantially independent of current mirror M6,M7. The same is true for the current mirrors M3M4 and M12M13. These basic circuits are reflected also in FIGS. 10*b*-10*d*, FIGS. 10*c* and 10*d* being connected to the opposite power supply terminals, the upper current mirrors using transistors of the opposite conductivity type than the lower current mirrors. Vref in the Figures is a current mirror voltage to provide a bias current to the circuits. Also when one of the upper nested mirrors is used with one of the lower nested mirrors, one of the nested mirrors will be coupled to the differential input from the differential input stage, as in the earlier Figures. Also in these Figures, the drain current provided by Vref (the current mirroring voltage) through the drains of transistors M12B and M10B respectively, are labeled as OUTA1. These drain currents are mirrored by mirror transistors M8A or M17A on the opposite side (top or bottom) of the circuit to transistors M8B or M17B, respectively, which drain currents are also labeled OUTA1. Similarly, the drains of the diode connected transistors of the nested mirror that are adjacent the transistors M8B, M10B, M12B and M17B, namely transistors M8A, M10A, M12A and M17A, are labeled as INA, and the drain circuits of the transistors to which they mirror current are labeled OUTA2. The drain circuits of the diode connected transistors of the other nested mirror are labeled IN2, as the currents in these drain circuits are mirrored to their companion transistors M16, M13, M9 AND M11, which drain circuits become OUT2. In all cases, OUTA1 of the top nested mirrors is connected to INA of the bottom nested mirrors, and OUTA1 of the bottom nested mirrors is connected to INA of the top nested mirrors. This then is the basic building block of the various embodiments of the present invention from which all embodiments are derived. Note that there are two variations of the upper pair of current mirrors (FIGS. 10*a* and 10*c*) and two variations of the lower pair of current mirrors (FIGS. 10*a* and 10*b*), thereby providing the four variations of FIGS. 10*a*-10*d* in the basic embodiments of the invention.

Also in general, OUTA2 of the top nested mirrors is connected to IN2 of the bottom nested mirrors, and OUTA2 of the bottom nested mirrors is connected to IN2 of the top nested mirrors. OUT2 then becomes the output, or one output, as shown in FIG. 11, from which the class AB control for the pull-up and pull-down transistors M22 and M21 of the output stage is derived, such as in FIGS. 6*c*, 6*f*, 7*b*, 8*b* and 9*b*.

Depending on the configuration and supply voltage, the proposed intermediate stages may require a start-up circuit to assist in finding their proper bias operating points. The start-up circuits will need to inject a small current into the intermediate stage, for example into any of the nodes labeled INA. Since such a one-sided current will cause some offset in the intermediate stage, the start-up circuit may include a detection function that shuts off the start-up current when the intermediate stage arrives at its desired operating point. Alternatively, the offset caused by the start-up current can be balanced out by injecting a current of identical magnitude into another node of the circuit, for example, any of the nodes labeled IN2. In one preferred embodiment, the equal currents are mirrored from the top rail into the INA and IN2 nodes of the bottom circuit.

In some cases, depending on the class AB output transistor drive circuitry, some transistors have companion transistors, but still the basic building block of the invention is present in all embodiments. These companion transistors split the output OUT2 of both the upper and lower nested mirrors into two current outputs, OUT2.1 and OUT2.2. In this case, the upper and lower nested mirrors are connected as shown in FIG. 12*a* or 12*b*. Further, there are two different ways of driving these companion transistors, which expands the number of combinations to eight. In any case, the current outputs OUT2.1 and OUT2.2 are drain currents, and thus high impedance current sources capable of delivering the current outputs OUT2.1 and OUT2.2 to different voltages. The transistors providing the current outputs OUT2.1 and OUT2 may be connected to an internal node, such that the ratio of current outputs OUT2.1 and OUT2.2 is substantially fixed, which ratio may or may not be one. Alternatively, the companion transistors may be connected to a control voltage Vab such that the currents in OUT2.1 and OUT2.2 are not related. The number of combinations is eight, not sixteen, as one of the companion transistors must be controlled by a control voltage Vab as shown in FIGS. 12*a* and 12*b*, typically a current mirroring voltage. Note however, that the circuits of FIGS. 12*a* and 12*b* may be turned over so to speak, using transistors of the opposite conductivity type.

FIGS. 13*a*-13*h* illustrate these variations. As can be seen therein, the companion transistors are companion to one of the diode connected transistors in each of the upper and lower nested current mirrors, with one of the companion transistors in each Figure being controlled by a control voltage Vab.

In the embodiments described herein, a PMOS transistor pair and associated current source form the differential input stage. Alternatively, an NMOS transistor pair and associated current source may be used, providing a differential current input to the upper nested mirrors. Also alternatively, both a PMOS transistor pair and associated current source and an NMOS transistor pair and associated current source may be used as the differential input stage, the gates of each PMOS transistor being coupled to the gate of a respective NMOS transistor, thereby enabling the circuit to operate with rail-to-rail common mode input capabilities. The embodiments described herein have been described with respect to CMOS transistors, though can be readily be realized with other active devices, such as, by way of example, bipolar junction transistors. Also, while the invention has been described with respect to operational amplifiers, it is also applicable to other amplifier systems, such as instrumentation amplifiers, audio amplifiers, weigh scale bridges, Hall effect sensors, high-side current sense circuits, voltage regulators, etc. Thus by using a low quiescent current, the present invention reduces power consumption almost to a theoretical minimum. Also the circuit will operate at an input of only 1.8V with a threshold voltage of 1V. The differential input stage and intermediate stage together provide a gain of over 100 dB. The resulting amplifiers have increased bandwidth, reduce input referred noise, reduced random input offset, reduced die area, increasing margin and allowing space saving packages, such as SC-70 packages. The class-AB operation of the intermediate stage lowers the power consumption, offset and noise. Also the intermediate stage can be optimized for both DC accuracy and high-speed performance. The intermediate stage creates high gain, due to the gain-boost effect.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. In an amplifier system, first and second circuits comprising:
   the first circuit of transistors of a first conductivity type having two current inputs INA and IN2, and three current outputs OUTA1, OUTA2 and OUT2;
   wherein the output current OUT2 is proportional to and mirrored from the input current IN2;
   the output current OUTA2 is proportional to the sum of first and second currents, the first current being mirrored from the input current INA and the second current being mirrored from the current in output OUTA1;
   the second circuit duplicating the first circuit using transistors of a second conductivity type;
   the current OUTA1 of the second circuit being a quiescent bias current;
   the input INA of the first circuit being coupled to the output OUTA1 of the second circuit, and the input INA of the second circuit being coupled to the output OUTA1 of the first circuit.

2. The circuits of claim 1 further comprising a differential input stage, the differential input stage being coupled to vary the current OUTA2 of the first circuit responsive to a differential input to the differential input stage.

3. The circuits of claim 2, wherein both current outputs OUT2 are each split into two current outputs OUT2.1 and OUT2.2 capable of delivering the current outputs OUT2.1 and OUT2.2 to different voltages.

4. The circuits of claim 1 further comprising a differential input stage, the differential input stage being coupled to vary the current OUT2 of the first circuit responsive to a differential input to the differential input stage.

5. The circuits of claim 1, wherein the current output OUT2 of one of the circuits is split into two current outputs OUT2.1 and OUT2.2 capable of delivering the current outputs OUT2.1 and OUT2.2 to two different voltages, the ratio between the two output currents OUT2.1 and OUT2.2 being set by a control voltage Vab.

6. The circuits of claim 1, wherein both current outputs OUT2 are each split into two current outputs OUT2.1 and OUT2.2 capable of delivering the current outputs OUT2.1 and OUT2.2 to different voltages.

7. The circuits of claim 1, wherein the input IN2 of the first circuit is coupled to the output OUTA2 of the second circuit, and the input IN2 of the second circuit is coupled to the output OUTA2 of the first circuit.

8. The circuits of claim 7, wherein both current outputs OUT2 are each split into two current outputs OUT2.1 and OUT2.2 capable of delivering the current outputs OUT2.1 and OUT2.2 to different voltages.

9. The circuits of claim 8, wherein both current outputs OUT2 are each split into two current outputs OUT2.1 and OUT2.2 by an additional transistor in each of the first and second circuits, and wherein a control voltage Vab of the additional transistor of one circuit is connected to an internal node, such that the ratio of current outputs OUT2.1 and OUT2.2 of that circuit is substantially fixed.

10. The circuits of claim 9, where the control voltage Vab of the additional transistor of the second circuit is connected to an internal node, such that the currents in OUT2.1 and OUT2.2 are equal.

11. The circuits of claim 7 wherein the circuits comprise:
    first and second power supply connections,
    the first circuit having first through seventh transistors of a first conductivity type and the second circuit having eighth through fourteenth transistors of a second conductivity type, each transistor having first and second terminals and a control terminal, the conduction between the first and second terminals being controlled by the voltage between the control terminal and the first terminal;
    the first and second transistors having their control terminals coupled together and to the second terminal of the third transistor, the second terminal of the first transistor being coupled to the first terminal of the third and fourth transistors;
    the second terminal of the second transistor being coupled to the first terminal of the fifth and sixth transistors;
    the control terminals of the third and fifth transistors being coupled together and to a voltage source;
    the control terminals of the fourth and sixth transistors being coupled together and to the second terminal of the sixth transistor;
    the second terminal of the third transistor being the current input INA, the second terminal of the fourth transistor being the current output OUT2, the second terminal of the sixth transistor being the current input IN2 and the second terminal of the fifth transistor being the current output OUT2A;
    the interconnection of the first through sixth transistors and their current inputs and outputs being duplicated by the interconnection of the eighth through thirteenth transistors and their current inputs and outputs, respectively;
    the first and second transistors having their first terminal coupled to the first power supply terminal and the eighth and ninth transistors having their first terminal coupled to the second power supply terminal;
    the second terminal of the first transistor being coupled to a first output of a differential input stage and the second terminal of the second transistor being coupled to a second output of a differential input stage.

12. The circuits of claim 11 wherein:
    the first terminal of the seventh transistor is coupled to the second terminal of the second transistor, the control terminal of the seventh transistor is coupled to mirror a quiescent current to the second terminal of the second transistor, and the second terminal of the seventh transistor is coupled as the current output OUTA1 of the first circuit;
    the first terminal of the fourteenth transistor is coupled to the first terminal of the tenth transistor, the control terminal of the fourteenth transistor is coupled to the voltage source associated with the second circuit, and the second terminal of the fourteenth transistor is coupled as the current output OUTA1 of the second circuit.

13. The circuits of claim 12, further comprised of a fifteenth transistor of the first conductivity type and a sixteenth transistor of the second conductivity type;
    the current output OUT2 of both circuits being split into two current outputs, OUT2.1 and OUT2.2;
    the fifteenth transistor having its first terminal coupled to the first terminal of the fifth transistor and its control terminal coupled to a control voltage Vab, the second terminal of the fifth transistor being the current output OUT2.1 and the second terminal of the fifteenth transistor being the current output OUT2.2;
    the sixteenth transistor having its first terminal coupled to the first terminal of the eleventh transistor and its control terminal coupled to the control terminal of the eleventh transistor, the second terminal of the eleventh transistor being the current output OUT2.1 and the second terminal of the sixteenth transistor being the current output OUT2.2;

current input INA of each circuit being coupled to the current output OUTA1 of the other circuit; and current input IN2 of each circuit being coupled to the current output OUTA2 of the other circuit.

14. The circuits of claim 12, further comprised of a fifteenth transistor of the first conductivity type and a sixteenth transistor of the second conductivity type;

the current output OUT2 of both circuits being split into two current outputs, OUT2.1 and OUT2.2;

the fifteenth transistor having its first terminal coupled to the first terminal of the fifth transistor and its control terminal coupled to the control terminal of the fifth transistor, the second terminal of the fifth transistor being the current output OUT2.1 and the second terminal of the fifteenth transistor being the current output OUT2.2;

the sixteenth transistor having its first terminal coupled to the first terminal of the eleventh transistor and its control terminal coupled to a control voltage Vab, the second terminal of the eleventh transistor being the current output OUT2.1 and the second terminal of the sixteenth transistor being the current output OUT2.2;

current input INA of each circuit being coupled to the current output OUTA1 of the other circuit; and current input IN2 of each circuit being coupled to the current output OUTA2 of the other circuit.

15. The circuits of claim 11 wherein:

the first terminal of the seventh transistor is coupled to the second terminal of the first transistor, the control terminal of the seventh transistor is coupled to mirror a quiescent current to the second terminal of the first transistor, and the second terminal of the seventh transistor is coupled as the current output OUTA1 of the first circuit;

the first terminal of the fourteenth transistor is coupled to the second terminal of the eighth transistor, the control terminal of the fourteenth transistor is coupled to the voltage source associated with the second circuit, and the second terminal of the fourteenth transistor is coupled as the current output OUTA1 of the second circuit.

16. The circuits of claim 15, further comprised of a fifteenth transistor of the first conductivity type and a sixteenth transistor of the second conductivity type;

the current output OUT2 of both circuits being split into two current outputs, OUT2.1 and OUT2.2;

the fifteenth transistor having its first terminal coupled to the first terminal of the fourth transistor and its control terminal coupled to a control voltage Vab, the second terminal of the fourth transistor being the current output OUT2.1 and the second terminal of the fifteenth transistor being the current output OUT2.2;

the sixteenth transistor having its first terminal coupled to the first terminal of the eleventh transistor and its control terminal coupled to the control terminal of the eleventh transistor, the second terminal of the eleventh transistor being the current output OUT2.1 and the second terminal of the sixteenth transistor being the current output OUT2.2;

current input INA of each circuit being coupled to the current output OUTA1 of the other circuit; and current input IN2 of each circuit being coupled to the current output OUTA2 of the other circuit.

17. The circuits of claim 15, further comprised of a fifteenth transistor of the first conductivity type and a sixteenth transistor of the second conductivity type;

the current output OUT2 of both circuits being split into two current outputs, OUT2.1 and OUT2.2;

the fifteenth transistor having its first terminal coupled to the first terminal of the fourth transistor and its control terminal coupled to the control terminal of the fourth transistor, the second terminal of the fourth transistor being the current output OUT2.1 and the second terminal of the fifteenth transistor being the current output OUT2.2;

the sixteenth transistor having its first terminal coupled to the first terminal of the eleventh transistor and its control terminal coupled to a control voltage Vab, the second terminal of the eleventh transistor being the current output OUT2.1 and the second terminal of the sixteenth transistor being the current output OUT2.2;

current input INA of each circuit being coupled to the current output OUTA1 of the other circuit; and current input IN2 of each circuit being coupled to the current output OUTA2 of the other circuit.

18. The circuits of claim 7 wherein the circuits comprise: first and second power supply connections, the first circuit having first through seventh transistors of a first conductivity type and the second circuit having eighth through fourteenth transistors of a second conductivity type, each transistor having first and second terminals and a control terminal, the conduction between the first and second terminals being controlled by the voltage between the control terminal and the first terminal;

the first and second transistors having their control terminals coupled together and to the second terminal of the third transistor, the second terminal of the first transistor being coupled to the first terminal of the third and fourth transistors;

the second terminal of the second transistor being coupled to the first terminal of the fifth and sixth transistors;

the control terminals of the third and fifth transistors being coupled together and to a voltage source;

the control terminals of the fourth and sixth transistors being coupled together and to the second terminal of the sixth transistor;

the second terminal of the third transistor being the current input IN2, the second terminal of the fourth transistor being the current output OUTA2, the second terminal of the sixth transistor being the current input INA and the second terminal of the fifth transistor being the current output OUT2;

the interconnection of the first through sixth transistors and their current inputs and outputs being duplicated by the interconnection of the eighth through thirteenth transistors and their current inputs and outputs, respectively;

the first and second transistors having their first terminal coupled to the first power supply terminal and the eighth and ninth transistors having their first terminal coupled to the second power supply terminal;

the second terminal of the first transistor being coupled to a first output of a differential input stage and the second terminal of the second transistor being coupled to a second output of a differential input stage.

19. The circuits of claim 18 wherein:

the first terminal of the seventh transistor is coupled to the second terminal of the second transistor, the control terminal of the seventh transistor is coupled to mirror a quiescent current to the second terminal of the second transistor, and the second terminal of the seventh transistor is coupled as the current output OUTA1 of the first circuit;

the first terminal of the fourteenth transistor is coupled to the second terminal of the ninth transistor, the control terminal of the fourteenth transistor is coupled to the control terminals of the eleventh and thirteenth transistors, and the second terminal of the fourteenth transistor is coupled as the current output OUTA1 of the second circuit.

20. The circuits of claim 19, further comprised of a fifteenth transistor of the first conductivity type and a sixteenth transistor of the second conductivity type;

the current output OUT2 of both circuits being split into two current outputs, OUT2.1 and OUT2.2;

the fifteenth transistor having its first terminal coupled to the first terminal of the fifth transistor and its control terminal coupled to a control voltage Vab, the second terminal of the fifth transistor being the current output OUT2.1 and the second terminal of the fifteenth transistor being the current output OUT2.2;

the sixteenth transistor having its first terminal coupled to the first terminal of the twelfth transistor and its control terminal coupled to the control terminal of the twelfth transistor, the second terminal of the twelfth transistor being the current output OUT2.1 and the second terminal of the sixteenth transistor being the current output OUT2.2;

current input INA of each circuit being coupled to the current output OUTA1 of the other circuit; and current input IN2 of each circuit being coupled to the current output OUTA2 of the other circuit.

21. The circuits of claim 19, further comprised of a fifteenth transistor of the first conductivity type and a sixteenth transistor of the second conductivity type;

the current output OUT2 of both circuits being split into two current outputs, OUT2.1 and OUT2.2;

the fifteenth transistor having its first terminal coupled to the first terminal of the fifth transistor and its control terminal coupled to the control terminal of the fifth transistor, the second terminal of the fifth transistor being the current output OUT2.1 and the second terminal of the fifteenth transistor being the current output OUT2.2;

the sixteenth transistor having its first terminal coupled to the first terminal of the twelfth transistor and its control terminal coupled to a control voltage Vab, the second terminal of the twelfth transistor being the current output OUT2.1 and the second terminal of the sixteenth transistor being the current output OUT2.2;

current input INA of each circuit being coupled to the current output OUTA1 of the other circuit; and current input IN2 of each circuit being coupled to the current output OUTA2 of the other circuit.

22. The circuits of claim 18 wherein:

the first terminal of the seventh transistor is coupled to the second terminal of the first transistor, the control terminal of the seventh transistor is coupled to mirror a quiescent current to the second terminal of the first transistor, and the second terminal of the seventh transistor is coupled as the current output OUTA1 of the first circuit;

the first terminal of the fourteenth transistor is coupled to the second terminal of the ninth transistor, the control terminal of the fourteenth transistor is coupled to the control terminals of the eleventh and thirteenth transistors, and the second terminal of the fourteenth transistor is coupled as the current output OUTA1 of the second circuit.

23. The circuits of claim 22, further comprised of a fifteenth transistor of the first conductivity type and a sixteenth transistor of the second conductivity type;

the current output OUT2 of both circuits being split into two current outputs, OUT2.1 and OUT2.2;

the fifteenth transistor having its first terminal coupled to the first terminal of the fourth transistor and its control terminal coupled to a control voltage Vab, the second terminal of the fourth transistor being the current output OUT2.1 and the second terminal of the fifteenth transistor being the current output OUT2.2;

the sixteenth transistor having its first terminal coupled to the first terminal of the twelfth transistor and its control terminal coupled to the control terminal of the twelfth transistor, the second terminal of the twelfth transistor being the current output OUT2.1 and the second terminal of the sixteenth transistor being the current output OUT2.2;

current input INA of each circuit being coupled to the current output OUTA1 of the other circuit; and current input IN2 of each circuit being coupled to the current output OUTA2 of the other circuit.

24. The circuits of claim 22, further comprised of a fifteenth transistor of the first conductivity type and a sixteenth transistor of the second conductivity type;

the current output OUT2 of both circuits being split into two current outputs, OUT2.1 and OUT2.2;

the fifteenth transistor having its first terminal coupled to the first terminal of the fourth transistor and its control terminal coupled to the control terminal of the fourth transistor, the second terminal of the fourth transistor being the current output OUT2.1 and the second terminal of the fifteenth transistor being the current output OUT2.2;

the sixteenth transistor having its first terminal coupled to the first terminal of the twelfth transistor and its control terminal coupled to a control voltage Vab, the second terminal of the twelfth transistor being the current output OUT2.1 and the second terminal of the sixteenth transistor being the current output OUT2.2;

current input INA of each circuit being coupled to the current output OUTA1 of the other circuit; and current input IN2 of each circuit being coupled to the current output OUTA2 of the other circuit.

* * * * *